(12) United States Patent
Herdendorf et al.

(10) Patent No.: US 11,570,919 B2
(45) Date of Patent: Jan. 31, 2023

(54) DATA STORAGE SYSTEM INCLUDING MOVABLE CARRIAGE AND PHYSICAL LOCKING MECHANISM

(71) Applicant: Seagate Technology LLC, Fremont, CA (US)

(72) Inventors: Brett Herdendorf, Mound, MN (US); Riyan Mendonsa, Edina, MN (US); Krishnan Subramanian, Shakopee, MN (US)

(73) Assignee: SEAGATE TECHNOLOGY, LLC, Fremont, CA (US)

(*) Notice: Subject to any disclaimer, the term of this patent is extended or adjusted under 35 U.S.C. 154(b) by 126 days.

(21) Appl. No.: 17/129,500

(22) Filed: Dec. 21, 2020

(65) Prior Publication Data

US 2022/0201884 A1    Jun. 23, 2022

(51) Int. Cl.
*H05K 5/02*    (2006.01)

(52) U.S. Cl.
CPC ......... *H05K 5/0291* (2013.01); *H05K 5/0221* (2013.01); *H05K 5/0247* (2013.01)

(58) Field of Classification Search
None
See application file for complete search history.

(56) References Cited

U.S. PATENT DOCUMENTS

| | | | |
|---|---|---|---|
| 5,059,772 A | 10/1991 | Younglove | |
| 5,870,245 A | 2/1999 | Kersey et al. | |
| 6,515,822 B1* | 2/2003 | White | G11B 17/225 360/92.1 |
| 6,956,715 B2* | 10/2005 | Mueller | G11B 17/225 360/92.1 |
| 6,983,469 B2* | 1/2006 | Steinhilber | G11B 17/225 |
| 7,180,701 B2 | 2/2007 | Armagost et al. | |
| 8,550,260 B1* | 10/2013 | Vircks | H05K 7/1412 211/208 |
| 8,611,042 B2* | 12/2013 | Schmidtke | G11B 17/225 360/92.1 |
| 9,601,149 B1* | 3/2017 | Todd | G11B 17/225 |
| 10,446,186 B1 | 10/2019 | Mendonsa et al. | |
| 11,259,437 B2* | 2/2022 | Wang | H05K 7/20172 |
| 2003/0040836 A1* | 2/2003 | Deckers | G11B 15/6835 700/214 |
| 2006/0010275 A1 | 1/2006 | Moon et al. | |
| 2008/0186614 A1* | 8/2008 | Kotaki | G11B 15/6835 |
| 2011/0285264 A1* | 11/2011 | Schmidtke | G11B 15/6835 206/307 |
| 2012/0286633 A1* | 11/2012 | Hashimoto | G11B 15/6835 312/215 |
| 2015/0362968 A1 | 12/2015 | Jurey et al. | |
| 2017/0245392 A1* | 8/2017 | Bilski, Jr. | H05K 7/20681 |

* cited by examiner

*Primary Examiner* — Xanthia C Cunningham

(57) ABSTRACT

An apparatus with a housing which stores a plurality of data storage magazines where each data storage magazine includes a plurality of data storage devices. The housing includes a movable carriage configured to selectively couple a set of data storage devices held by a particular data storage magazine to a host device. The housing also includes a physical locking mechanism configured to selectively prevent data storage devices from coupling to the host device.

20 Claims, 16 Drawing Sheets

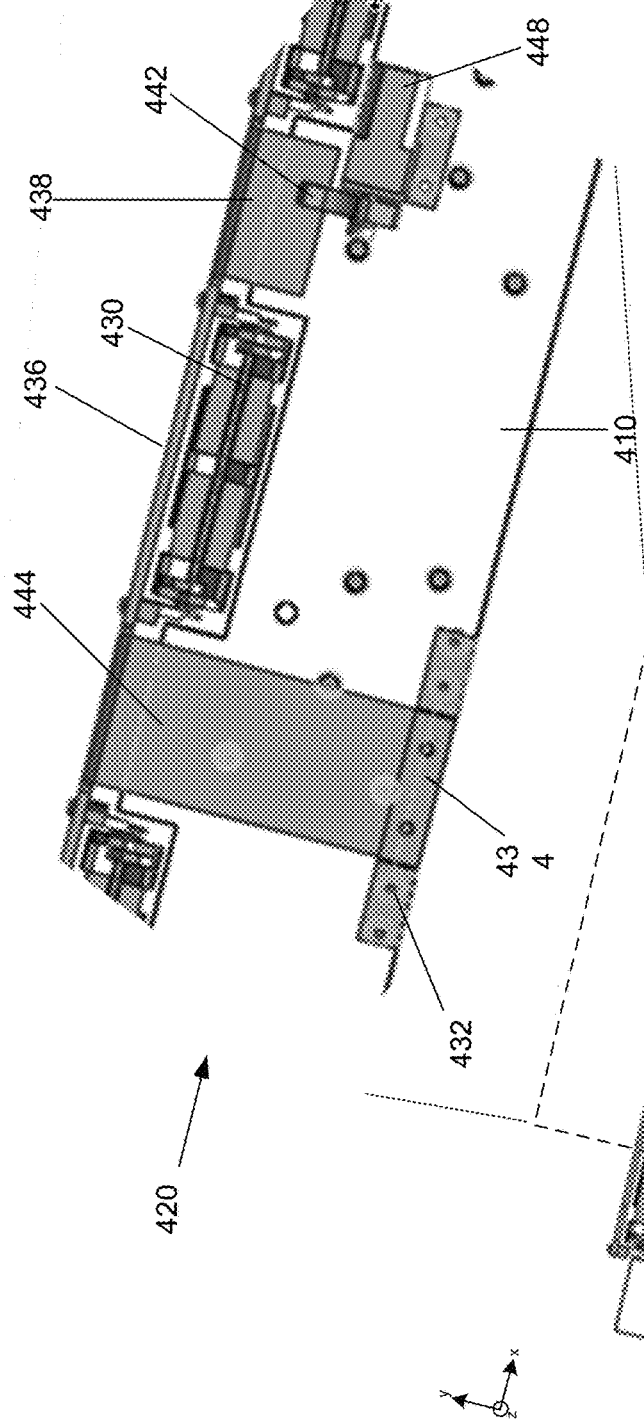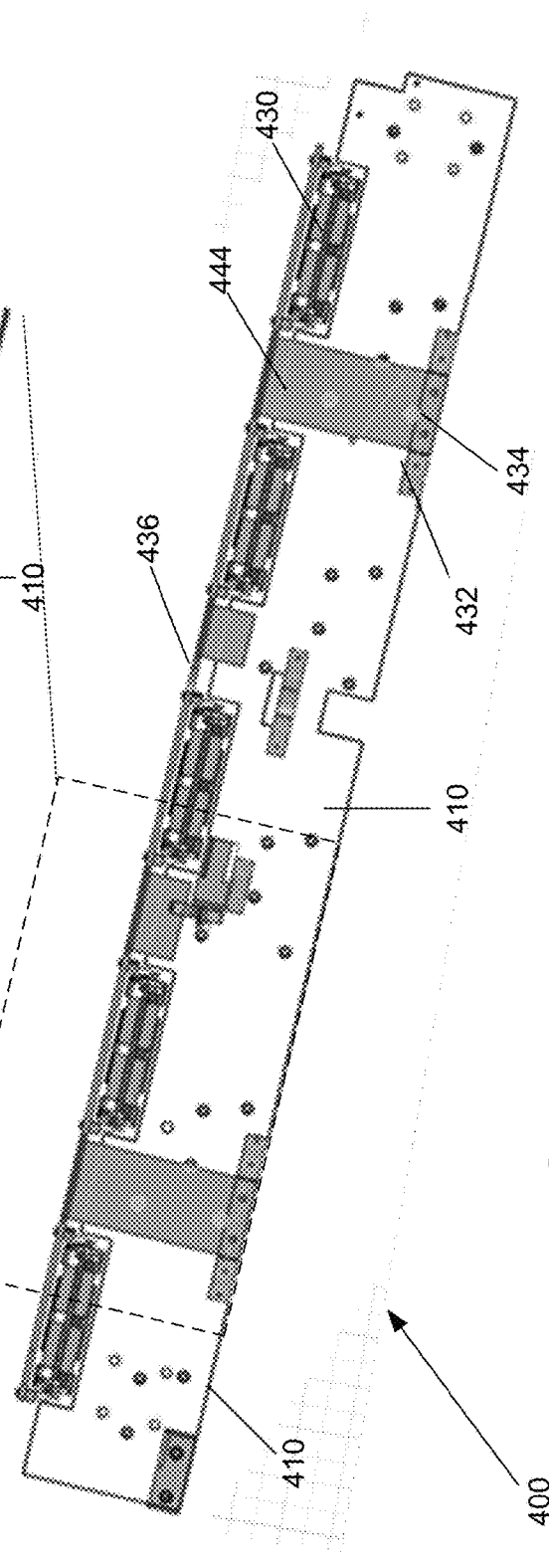

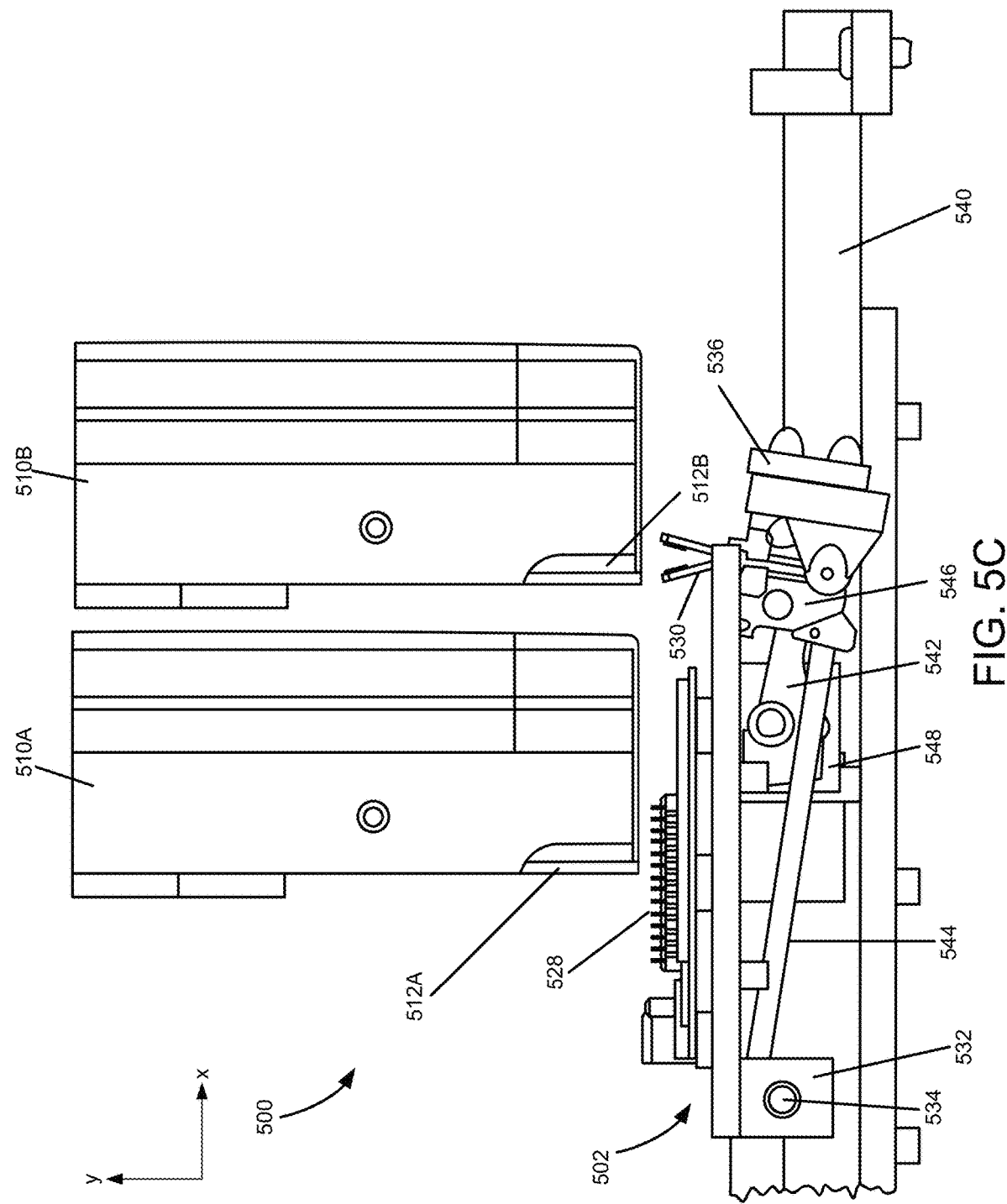

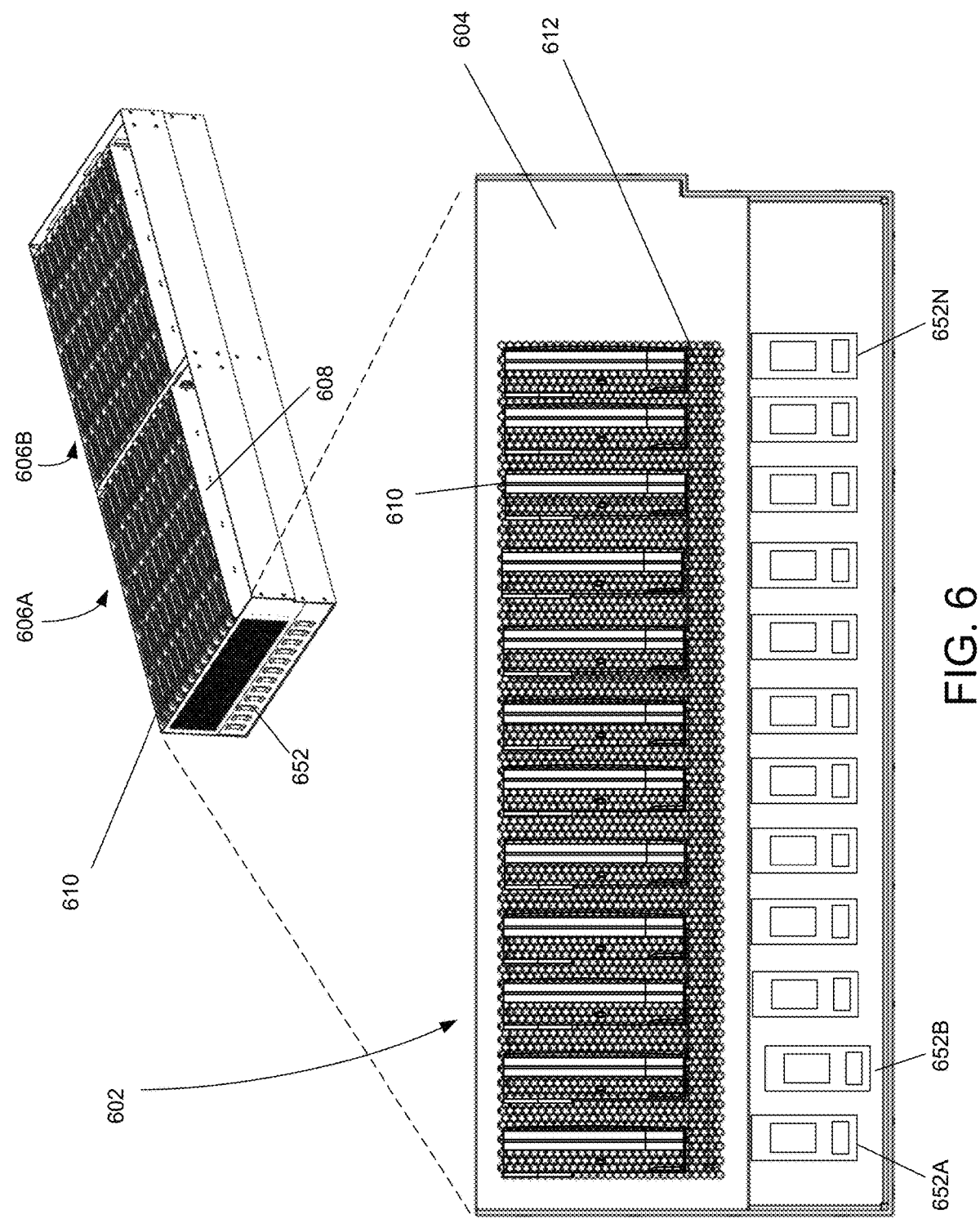

DATA STORAGE SYSTEM INCLUDING MOVABLE CARRIAGE AND PHYSICAL LOCKING MECHANISM

TECHNICAL FIELD

The disclosure relates to a data storage system.

BACKGROUND

Data storage systems often include numerous data storage devices stored within a cabinet or rack. In some examples of online data storage devices, all of the data storage devices are continuously communicatively coupled to a host device, such that the host device may access data from any or all of the data storage devices at any given time. In such examples, the data storage devices may generate large amounts of heat and consume enormous amounts of power (e.g., powering and cooling the data storage devices). In some cold or offline data storage examples, data storage devices (e.g., tapes) are stored such that the data storage devices must be retrieved and loaded into another device to read and write data. In such examples, the time to data may take tens of seconds to multiple minutes. The computational storage landscape spans a vast range of archival space with incumbent options for storage ranging from so-called 'glacial' or 'cold' storage (e.g., microfiche, tape, or optical storage) to 'hot' storage (e.g., a continuously online hard drive or flash storage). Time to data (TTD) decreases as the migration from glacial to warm storage is made but there is a corresponding increase in cost with such a migration. For example, decreasing TTD typically increases power consumption.

SUMMARY

The present disclosure describes a data storage system configured to store a plurality of data storage devices and a movable carriage configured to selectively couple to various subsets of plurality of data storage devices. In one example, the data storage system includes a housing configured to store a plurality of data storage magazines in rows. Each data storage magazine is configured to hold or support a plurality of data storage devices. The data storage system also includes a movable carriage that selectively couples a host device to the data storage devices of a particular data storage magazine. In contrast to examples where all of the data storage devices are continuously coupled to a host device, selectively coupling various data storage devices to the host device may reduce the amount of power consumed by the data storage devices and may reduce the amount of heat generated by the data storage devices, which may reduce the energy and cost of cooling the data storage devices.

In some scenarios, the data storage system includes a physical locking mechanism configured to selectively prevent the carriage from coupling to one or more rows of data storage devices. In one scenario, the physical locking mechanism prevents the carriage from coupling to the data storage devices by physically preventing the carriage from moving vertically towards the data storage devices and/or preventing the carriage from moving horizontally between different sets of data storage devices. Physically preventing the carriage from moving vertically and/or horizontally may prevent the host device from communicatively coupling to the various data storage devices. In this way, the data storage system may increase the security of the data storage devices and reduce or eliminate unauthorized access to the data storage devices.

In one example, an archival data storage system housing includes a plurality of data storage magazines, each data storage magazine of the plurality of data storage magazines configured to hold a respective plurality of data storage devices. A movable carriage is disposed within the housing and is configured to selective couple a set of data storage devices held by a particular data storage magazine to a host device. A physical locking mechanism is disposed within the housing, and is configured to prevent the carriage interconnects of the movable carriage from coupling to the drive interconnects of the particular data storage device by preventing the movable carriage from moving vertically toward the particular data storage device.

These and other features and aspects of various examples may be understood in view of the following detailed discussion and accompanying drawings.

BRIEF DESCRIPTION OF THE DRAWINGS

FIG. 4A is a bottom perspective view of an example movable carriage, in accordance with various aspects of the present disclosure. FIG. 4B is a zoomed-in bottom perspective view of a portion of the movable carriage of FIG. 4A.

FIGS. 5A, 5B, 5C and 5D represent side views of a data storage apparatus including a movable carriage, in accordance with various aspects of the present disclosure.

FIG. 6 is a perspective view of an example data storage chassis, in accordance with various aspects of the present disclosure.

DETAILED DESCRIPTION

Figure 1:
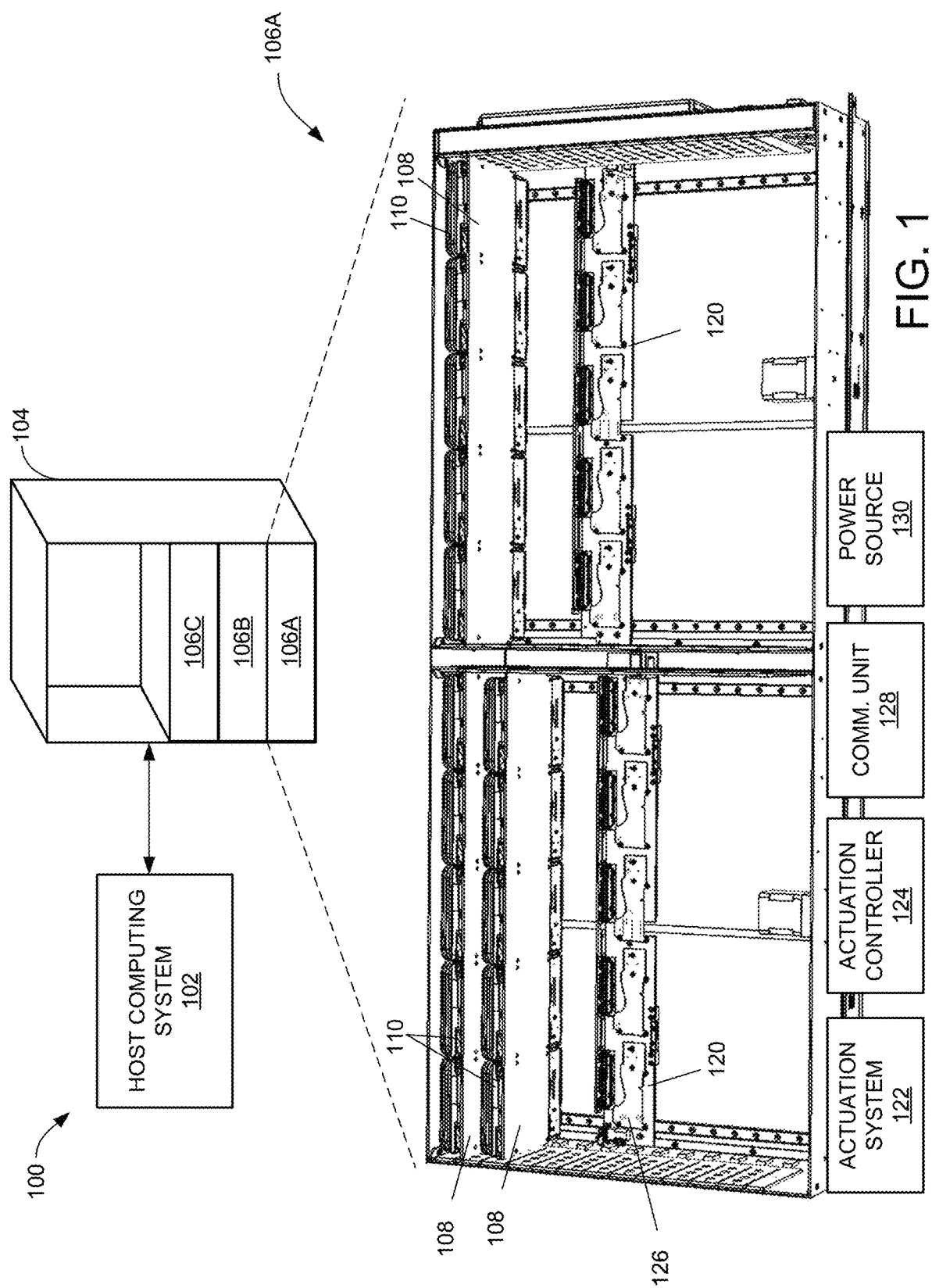
FIG. 1 illustrates an example nearline data archival system configured to selectively couple data storage devices to a host computing device, in accordance with one or more aspects of the present disclosure.

FIG. 1 illustrates an example data storage system configured to selectively couple data storage devices to a host computing device, in accordance with one or more aspects of the present disclosure. System 100 includes host computing system 102 and data storage rack 104. In some examples, system 100 is configured to maintain some or all of data storage devices 110 in an off or low power state until selectively powered and/or accessed by carriage 120. In other words, in contrast to online storage where all of the data storage devices are immediately available for reading and writing data, some data storage devices within system 100 may not be immediately available for reading and writing data, but can be brought online relatively quickly (e.g., compared to offline data storage) with minimal or no human intervention.

Host computing system 102 represents any type of computing system that is configured to read data from and write data to a data storage device. Examples of host computing system 102 include cloud computing environments, servers, desktop computers, laptop computers, mobile phones, tablet computers, televisions, automobiles, or any other type of mobile or non-mobile computing device that is configured to read and write data.

Data storage rack 104 includes a plurality of chassis 106A-106C (collectively, chassis 106). In some examples, each chassis 106 is removable from data storage rack 104. Each chassis 106 is configured to store a plurality of data storage magazines 108 and data storage devices 110.

In some examples, each data storage magazine 108 is configured to hold or support at least one data storage device 110. In one example, each data storage magazine holds a plurality of data storage devices 110 (e.g., in a row or other arrangement). In the example of FIG. 1, each data storage magazine 108 is configured to hold five data storage devices 110. However, data storage magazines 108 may hold additional or fewer data storage devices 110. In some examples, data storage magazines 108 are configured to be insertable into, and removable from, a housing of chassis 106. In one example, data storage magazines 108 are fixed within (e.g., integral with) the housing of chassis 106. Data storage magazines 108 may include metal (e.g., aluminum, stainless steel, or other metal), printed circuit board (PCB), and/or other rigid material.

Data storage devices 110 store data, such as data received from host computing system 102. Examples of data storage devices 110 include hard disk drives (HDDs), solid state drives (SSDs), and magnetic tape drives, among others. Each data storage device 110 includes a drive interconnect configured to physically and communicatively couple the respective data storage device 110 to a corresponding carriage interconnect of carriage 120.

In some examples, each data storage chassis 106 includes at least one carriage 120, an actuation system 122, a communication (comm.) unit 128, and a power source 130. Communication unit 128 communicates with host computing system 102 via one or more wired and/or wireless communication protocols. Examples of communication unit 128 include an optical transceiver, radio frequency transceiver, a network card (e.g., an Ethernet card), among others. Examples of power source 130 include a battery and a power supply unit, among other examples.

Actuation system 122 is configured to move carriage 120 within chassis 106. Actuation system 122 includes a motor that propels the carriage 120 in one or more directions across a stage. The stage may be, for example, a rail, a cable pulley, or other track usable to guide movement of carriage 120. Examples of actuation system 122 include a linear motion actuator (e.g., a rack and pinion linear actuator), a belt-driven linear actuator, a V-guide rail and wheel system, or a screw rail actuator and screw rail guide, among others. In some examples, actuation system 122 includes one or more position sensors configured to detect the position of carriage 120 within chassis 106. Examples of position sensors include Hall Effect sensors, inductive sensors, linear variable differential transformers, position encoders, piezo-electric transducers, among others.

Carriage 120 (also referred to as movable carriage 120) is configured to communicatively couple data storage devices 110 to host computing system 102. In one example, carriage 120 is configured to selectively couple host computing system 102 to a set of data storage devices 110 that are physically coupled to a particular data storage magazine 108. That is, in some examples, each carriage 120 selectively couples host computing system 102 to a single row of data storage devices 110 at any particular time. For example, actuation system 122 may move carriage 120 from one set of data storage devices 110 (e.g., a particular row of data storage devices 110 attached to a particular data storage magazine 108) to another set of data storage devices 110 (e.g., another row of data storage devices 110 that are attached to another data storage magazine 108).

In some examples, chassis 106 includes one or more chassis controllers 124 and one or more drive controllers 126. While carriage 120 includes drive controllers 126 in the example of FIG. 1, in some examples, data storage devices 110 include drive controllers 126. In some examples, data storage rack 104 may include chassis controllers 124 and/or drive controllers 126.

In some examples, chassis controllers 124 and drive controllers 126 include hardware, hardware and software, hardware and firmware, or a combination thereof suitable to perform the techniques attributed to chassis controllers 124 and drive controllers 126. Examples of controllers include processors, microprocessors, peripheral interface controllers ("PICs"), application-specific integrated circuits ("ASICs"), systems on chips ("SoCs"), field programmable gate arrays (FPGAs), etc.

While not shown in FIG. 1, chassis controllers 124 and drive controllers 126 may include tangible memory configured to store data, such as non-volatile memory (e.g., flash memory, solid state devices (SSDs), hard disk drives (HDDs)), or volatile memory (e.g., random access memory (RAM)). It should be understood, however, that memory does not include connections, carrier waves, signals, or other transient signal transport mechanism, but are instead directed to non-transient, tangible memory. In some examples, the memory may be external to one or more controllers (e.g., may be external to a package in which one or more controllers are housed). The memory may store computer-executable instructions which may be executed by a processor to perform the functionality of the processor.

Drive controllers 126 are communicatively coupled to carriage 120 and are configured to control read/write circuitry and mechanics of data storage devices 110. Read/write circuitry includes circuitry that powers and/or facilitates data access (e.g., read and/or write access) to data storage devices 110. Read/write circuitry may include a preamplifier, a slider (e.g., including a reader, a writer, and/or a heater), a microactuator, or any other component that powers or facilitates data access to data storage devices 110. Mechanics may include devices that facilitate or prevent motion of components in data storage devices 110, such as motors (e.g., spindle motors), voice coils, ramps, or suspensions. In some examples, a spindle motor rotates the magnetic recording media of data storage devices 110.

Chassis controller 124 controls actuation system 122 to regulate movement of carriage 120. In one example, chassis controller 124 may output one or more commands to move between data storage magazines 108. For example, the commands cause carriage 120 to move from a first position that enables carriage 120 to communicatively couple to one set of data storage devices 110 to a different position that enables carriage 120 to communicatively couple to another set of data storage devices 110. In some examples, data storage devices 110 that are not communicatively coupled to carriage 120 may be in a low-power state or an off-state (e.g., powered off), and may be powered to full power or near full power when communicatively coupled to carriage 120.

In this way, techniques of this disclosure may enable movable carriage 120 to selectively couple to different sets of data storage devices. Moving carriage 120 between sets of data storage devices 110 may enable host computing system 102 to access data storage devices 110 more quickly than offline data storage techniques, while potentially reducing the amount of energy consumed by data storage devices 110 relative to online data storage techniques.

Figure 2:
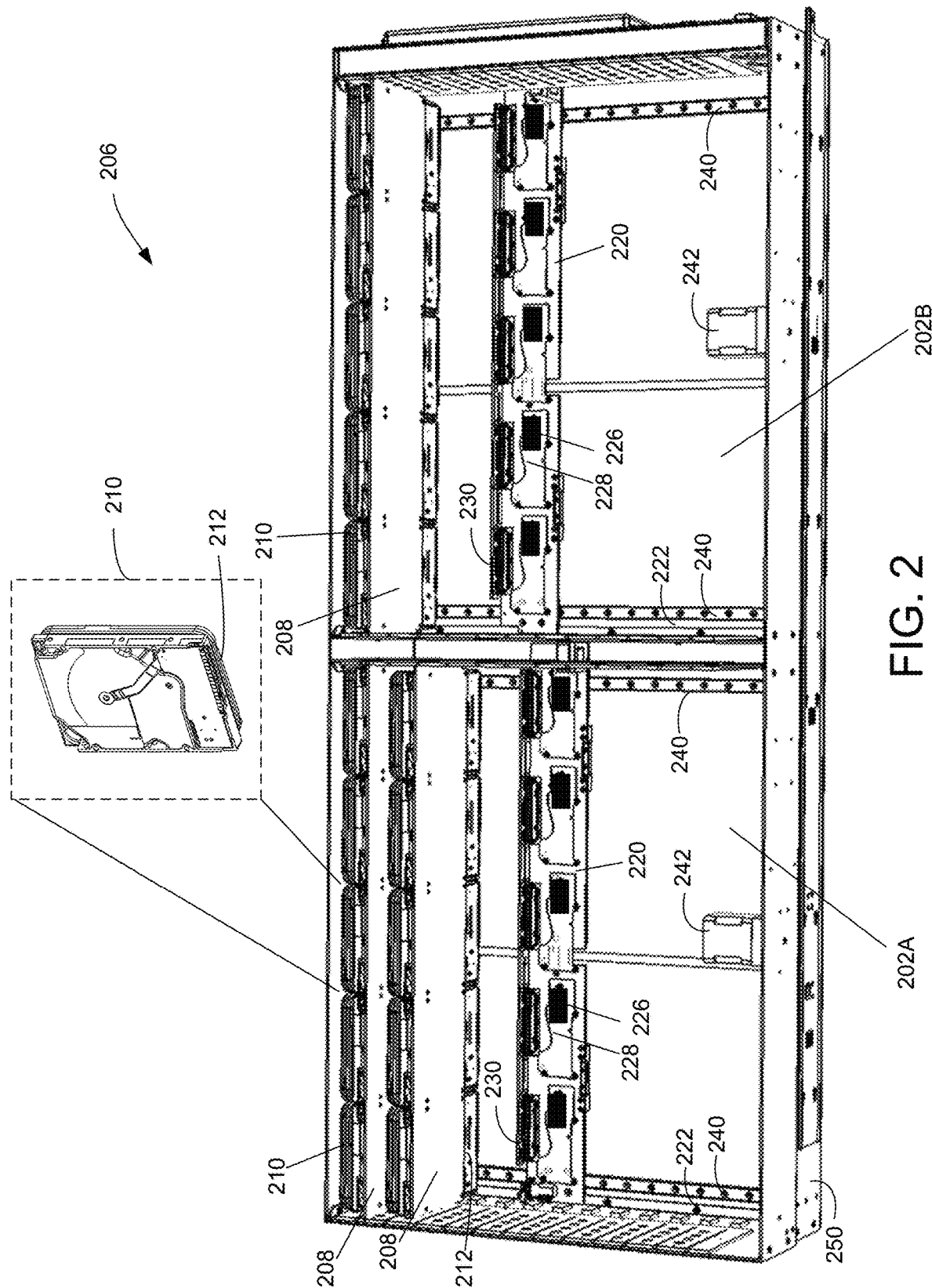
FIG. 2 is a perspective view of an example data storage chassis, according to various aspects of the present disclosure.

FIG. 2 is a perspective view of an example data storage chassis, according to various aspects of the present disclosure. Chassis 206 is configured to store a plurality of data storage magazines 208 and data storage devices 210. In the example of FIG. 2, chassis 206 is divided into a plurality of compartments 202A and 202B (collectively, compartments 202) that are each configured to store a plurality of data storage magazines. Chassis 206 may include more or fewer compartments 202. While chassis 206 is illustrated as storing two data storage magazines 208 in a first compartment 202A and one data storage magazine 208 in the second compartment 202B, chassis 206 may be configured to store any number of data storage magazines (e.g., 10, 15, 20, or more data storage magazines within each compartment 202). Each data storage magazine 208 is configured to hold or support a plurality of data storage devices 210 (e.g., in rows). While FIG. 2 illustrates data storage magazines 208 supporting data storage devices 210 in rows, in some examples data storage magazines 208 may hold data storage devices 210 in different orientations or configurations. In some examples, chassis 206 is configured to store individual data storage devices 210.

In some examples, data storage devices 210 include a plurality of HDDs that each include a housing enclosing rotatable magnetic recording media (e.g., disks) and at least one data read/write transducer (e.g., a head). In some examples, data storage devices 210 may include SSDs, magnetic tape, or other data storage device. Each of data storage devices 210 include a drive interconnect 212 configured to physically and communicatively couple the respective data storage device 210 to a corresponding carriage interconnect 230 of carriage 220. In the example of FIG. 2, drive interconnects 212 and carriage interconnects 230 are configured to communicatively couple data storage devices 210 and carriage 220 via an interface, such as a serial advanced technology attachment (SATA) interface, a serial attached small computer system interface (SAS), a peripheral component interconnect express (PCIe) interface, a universal serial bus ("USB") interface, or any other type of interface.

Chassis 206 includes housing 250 configured to slide in and out of a stowed position within a data storage rack (e.g., data storage rack 104 of FIG. 1). Housing 250 may include a metal (e.g., stainless steel, aluminum, or other metal), plastic, PVC, or any other material suitable for storing data storage devices 210 within a data storage rack. In some examples, chassis 206 is adapted to fit within or otherwise have overall dimensions that correspond to an industry standard data storage rack (e.g., a 42 U rack), or with other suitable dimensions to facilitate integration into existing data storage environments such as magnetic tape-based solutions.

Each compartment 202 of chassis 206 includes at least one movable carriage 220, at least one flexible cable 222, and an actuator 242 configured to move carriage 220 within housing 250. In the example of FIG. 2, actuator 242 moves carriages 220 within housing 250 by propelling carriage 220 along a first axis of stage 240. Examples of actuator 242 include a brushless motor, a brushed motor, a direct drive motor, linear motor, servo motor, stepper motor, etc. Stage 240 may include, for example, a rail, a cable pulley, or other track usable to guide movement of carriage 220 relative to housing 250. In some instances, each carriage 220 is disposed between data storage magazines 208 and a bottom surface of housing 250 and traverses stage 240 between data storage magazines 208 and the bottom surface of housing 250.

In some examples, flexible cable 222 communicatively couples carriage 220 to a host device (e.g., host computing system 102 of FIG. 1) via a chassis controller (e.g., chassis controller 124 of FIG. 1). In one example, flexible cable 222 is configured to power and exchange data with carriage 220. For example, flexible cable 222 may transmit current to operate data storage devices 210, couple/de-couple carriage interconnects 230 from drive interconnects 212, or both. While illustrated as a flexible cable, in some examples, chassis 206 communicatively couples carriage 220 to the host via an optical system, or other communication system.

In some examples, each carriage 220 is configured to selectively couple to a set of data storage devices 210. In other words, each carriage 220 is configured to selectively couple the host computing system to a set of data storage devices 210 that are held by a particular data storage magazine. Said yet another way, each carriage 220 selectively couples to a single row of data storage devices 210 that are all coupled to the same data storage magazine 208. In some examples, the quantity of interconnects on the movable carriage is equal to the number of data storage devices that each data storage magazine is configured to hold. For example, each carriage 220 includes a plurality of carriage interconnects 230 that are configured to communicatively couple to a respective drive interconnect 212. In one example, each carriage interconnect 230 couples to a respective drive interconnect 212 of a set of data storage devices 210 (e.g., two, three, four, five, or more adjacent data storage devices 210) at a particular time to provide parallel (e.g., simultaneous) data access to each of the data storage devices 210 in the set (e.g., a set of data storage devices held by a particular data storage magazine). In some instances, each carriage 220 operates independently such that each carriage 220 may couple to a different row of data storage devices 210. By coupling carriage 220 to a particular set of data storage devices 210 held by a single data storage magazine 208, carriage 220 powers (e.g., power-on, power-off, spin-up, spin-down, etc.) that particular set of data storage devices 210 without powering each of the data storage devices 210 within the chassis 206, which may reduce the amount of energy consumed by data storage devices 210. This system-configuration permits the individual data storage devices to be individually removed, serviced, and/or replaced without affecting a flow of data to or from any of the other data storage drives sharing the same control electronics (e.g., the components on PCB 228).

Carriages 220 may each include a plurality of drive controllers 226. For example, data storage devices 210 may not include drive controllers to control read/write circuitry of the respective data storage devices and may include an interposer that transmits data and signals between the read/write circuitry of data storage devices 210 and drive controllers 226 of carriages 220. In the example of FIG. 2, carriage 220 includes five drive controllers 226 that are each disposed on a respective PCB 228. Carriage 220 may include fewer or additional drive controllers 226. While carriage 220 is illustrated as including drive controllers 226, in some instances, each of data storage devices 210 includes drive controllers 226. In such instances, PCBs 228 may represent an interposer that transmits data and commands to/from data storage devices 210 and a chassis controller (e.g., a server or rack-level controller).

In operation, the chassis controller transmits data access commands (e.g., read and/or write commands) to carriage 220 via flexible cable 222. The data access commands may specify target logical block addresses (LBA) for executing associated data access operations. Responsive to receiving a data access command, the chassis controller identifies one or more physical data storage devices 210 located within chassis 206 that corresponds to the target LBAs using a stored logical-to-physical block map. The chassis controller outputs a signal to cause actuator 242 to robotically propel carriage 220 across stage 240 to a particular position suitable for accessing the identified data storage devices 210.

Carriage 220 couples to a set of data storage devices 210 (e.g., a row of data storage devices 210 attached to a particular data storage magazine 208) when carriage 220 reaches the particular position. In some examples, carriage 220 lifts carriage interconnects 230 towards drive interconnects 212 to communicatively couple the set of data storage devices 210 to carriage 220.

In some examples, the chassis controller outputs the data access command to one or more drive controllers 226. Drive controllers 226 may receive the data access commands and may control the read/write circuitry of the set of data storage devices 210 in response to receiving the data access commands.

In accordance with techniques of this disclosure, a movable carriage may selectively couple a set of data storage devices to a host computing system. Selectively coupling a set of the data storage devices stored within a chassis may enable some of the data storage devices to be powered down or in a low powered state, which may reduce the amount of energy consumed by the data storage devices. Utilizing a movable carriage may enable a host computing system to access data storage devices relatively quickly compared to offline data storage systems, which may increase read and write operations.

Figure 3:
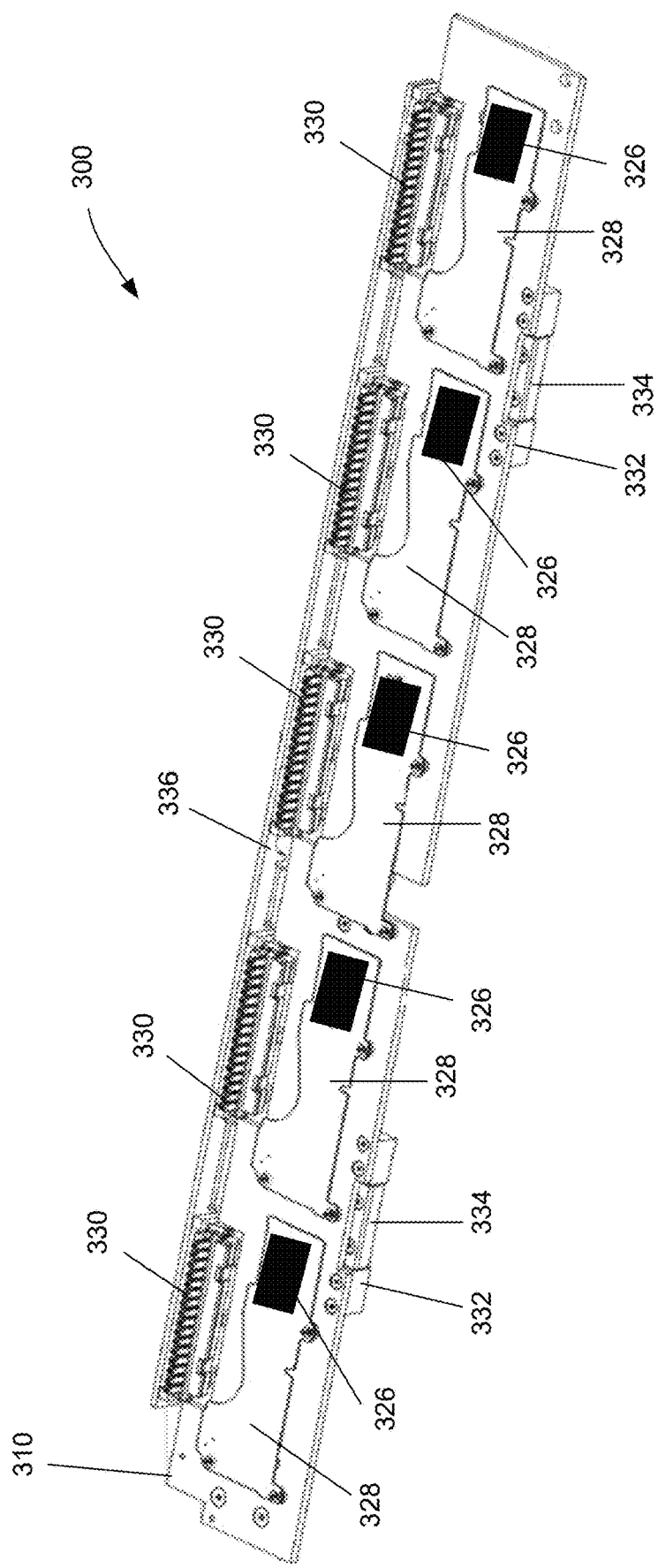
FIG. 3 is a top perspective view of a movable carriage, in accordance with various aspects of the present disclosure.

FIG. 3 is a top perspective view of a movable carriage, in accordance with various aspects of the present disclosure. Carriage 300 (also referred to as movable carriage 300) includes a baseplate 310, a plurality of PCBs 328 disposed on a top surface of baseplate 310, and a plurality of carriage interconnects 330.

In the example of FIG. 3, each of PCBs 328 includes a respective drive controller 326 communicatively coupled to a respective carriage interconnect 330. Each drive controller 326 is configured to receive data access commands (e.g., read commands and/or write commands) from a host computing system (e.g., host computing system 102 of FIG. 1) and output control signals to a respective data storage device in response to receiving the data access commands. For example, drive controller 326 may output a control signal (e.g., a read signal, a write signal, or a heater activation signal) to control the slider of a data storage device. As one example, each of drive controllers 326 may output a write signal to the slider of a given data storage device via a respective carriage interconnect 330 to cause the data storage device to write data.

While FIG. 3 illustrates PCBs 328 as including drive controllers 326, in some scenarios, PCBs 328 are configured to route data access commands to a drive controller of a data storage device. That is, in some scenarios, PCBs 328 may be interposer devices that do not include drive controllers and that relay data access commands from the host computing system to drive controllers located on the data storage devices. PCBs 328, can also be a single PCB configured to interact with one or more data storage devices simultaneously.

Carriage 300 includes tilt bar backplate 336. In one example, tilt bar backplate 336 is disposed on a proximal side of carriage 300. Tilt bar backplate 336 is physically coupled (e.g., directly coupled) to each of carriage interconnects 330.

Carriage 300 includes one or more tilt bar hinges 332 and one or more tilt bar pivot points 334. Tilt bar hinges 332 and tilt bar pivot points 334 are located on a distal side of carriage 300 that is opposite the proximal side of carriage 300. While FIG. 3 illustrates two tilt bar hinges 332 and two tilt bar pivot points 334, carriage may include fewer or additional tilt bar hinges and pivot points in some examples. Examples of tilt bar hinges 332 include dowel hinges, flexure hinges, flush hinges, and pivot hinges, among other types of hinges.

In one example, tilt bar backplate 336 is rotatably coupled to tilt bar hinges 332 via a respective tilt bar extension disposed beneath baseplate 310 (see FIGS. 4A and 4B). Tilt bar hinges 332 rotate about tilt bar pivot points 334 to move (e.g., raise and lower) carriage interconnects 330 vertically relative to baseplate 310.

Tilt bar hinges 332 rotate about pivot points 334 to connect and disconnect carriage interconnects 330 from data storage devices 210 of FIG. 2. In one example, tilt bar hinges 332 rotate towards a bottom surface of the housing of chassis 206 of FIG. 2 thereby moving carriage interconnects 330 vertically away from data storage devices (e.g., lowering carriage interconnects 330 from the data storage devices). For example, a controller (e.g., chassis controller 124) may disconnect carriage interconnects 330 from the respective data storage devices 210 by outputting a command causing tilt bar hinges 332 to rotate about tilt bar pivot points 334 away from data storage devices 210, which may lower carriage interconnects 330 from the data storage devices 210. In another example, the controller may connect carriage interconnects 330 to data storage devices 210 by outputting a command causing tilt bar hinges 332 to rotate about tilt bar pivot points 334 towards data storage devices 210. In this way, the controller communicative couples and decouples carriage interconnect 330 with drive interconnects 212 of data storage devices 210 of FIG. 2.

FIG. 4A is a bottom perspective view of an example movable carriage, in accordance with various aspects of the present disclosure. FIG. 4B is a zoomed-in bottom perspective view of a portion of the movable carriage of FIG. 4A. Carriage 400 (also referred to as movable carriage 400) includes a baseplate 410, a plurality of carriage interconnects 430, and at least one tilt bar 420.

Tilt bar 420 includes tilt bar hinge 432, tilt bar pivot point 434, tilt bar backplate 436, tilt bar tab 438 and tilt bar extension 444. In one example, tilt bar hinge 432 and tilt bar pivot point 434 are located on a distal side of carriage 400. In some examples, tilt bar backplate 436 is physically coupled to carriage interconnects 430 on the proximal side of carriage 400.

In one example, tilt bar backplate 436 is configured to rotate about pivot point 434. For example, as illustrated in FIGS. 4A and 4B, tilt bar backplate 435 is rotatably coupled to tilt bar hinge 432 via tilt bar extension 444. In one example, tilt bar extension 444 is mechanically coupled to tilt bar backplate 436 on a proximal side of carriage 400 and tilt bar hinges 432 on the distal side of carriage 400. That is, in some examples, tilt bar extension 444 extends across the bottom surface of baseplate 410 and mechanically couples tilt bar backplate 436 with tilt bar hinges 432 and tilt bar pivot point 434 to enable tilt bar backplate 436 to rotate about pivot point 434. Tilt bar backplate 436 and tilt bar extension 444 may include metal (e.g., stainless steel, aluminum, or any other suitable material).

In some examples, tilt bar 420 includes tilt bar tab 438. Tilt bar tab 438 may be located on a proximal side of carriage 400. For example, as shown in FIGS. 4A and 4B, tilt bar tab 438 is mechanically coupled to tilt bar backplate 436 and protrudes from tilt bar backplate 436 across a portion of the bottom surface of baseplate 410.

In the example of FIG. 4B, tilt bar 420 includes tilt arm 442 and tilt arm actuator 448. Tilt arm 442 is configured to raise and/or lower tilt bar backplate 436 to couple carriage interconnects 430 to, and decouple carriage interconnects 430 from drive interconnects. For example, tilt arm actuator 448 is physically coupled (e.g., directly coupled) to tilt arm 442 and may rotate tilt arm 442 towards tilt bar tab 438, which may cause tilt bar tab 438 to lift tilt bar backplate 436 (and hence carriage interconnects 430) towards a set of data storage devices and the respective drive interconnects. Both tilt arm 442 and tilt arm actuator 448 are disposed on a bottom surface of baseplate 410 on the proximal side of carriage 400 (e.g., opposite the distal side of carriage 400). While FIG. 4B. illustrates a single tilt arm 442 and a single tilt arm actuator 448, tilt bar 420 may, in some examples, include additional tilt arms and tilt arm actuators.

In operation, in some examples, after chassis controller 124 of FIG. 1 outputs commands signals to cause actuator 242 of FIG. 2 to robotically propel carriage 400 across stage 240 of FIG. 2 to a target position along the X-Y plane (e.g., a position beneath a row of data storage devices 210 for accessing the row of data storage devices 210), chassis controller 124 of FIG. 1 further commands tilt arm actuator 448 to engage and rotate tilt arm 442. That is, chassis controller 124 may output a command causing actuator 448 to rotate tilt arm 442. Tilt arm 442 rotates (e.g., around the X-axis) causing tilt arm 442 to physically contact tilt bar tab 438. In the examples of FIGS. 4A and 4B, tilt arm 442 is shown in its rotated orientation and is in physical contact with tilt bar tab 438. Tilt arm 442 rotates about the x-axis and drives tilt bar tab 438 towards data storage devices 210 (e.g., in the Z-direction), which causes tilt bar extension 444 to rotate around tilt bar pivot point 434. Rotating tilt bar extension 444 about tilt bar pivot point 434 extends (e.g., lifts) tilt bar backplate 436 (and hence carriage interconnects 430) away from the top surface of baseplate 410 towards data storage device 210. In some examples, rotating tilt bar backplate 436 results in almost vertical displacement of carriage interconnects 430 due to the short angle of rotation about pivot point 434 relative to the length of tilt bar extension 444. While the examples of FIGS. 4A and 4B illustrate carriage interconnects 430 moving vertically by rotating tilt bar extension 444 and tilt bar backplate 436 around tilt bar pivot point 434, other methods of vertical translation may be used in some examples.

FIGS. 5A-5D represent side views of a data storage chassis including a movable carriage, in accordance with various aspects of the present disclosure. Data storage chassis 500 includes data storage devices 510A and 510B and movable carriage 502 (also referred to as carriage 502) disposed on a top surface of stage 540. Data storage devices 510A and 510B (collectively, data storage devices 510) include respective drive interconnects 512A and 512B (collectively, drive interconnects 512).

Figure 5A:
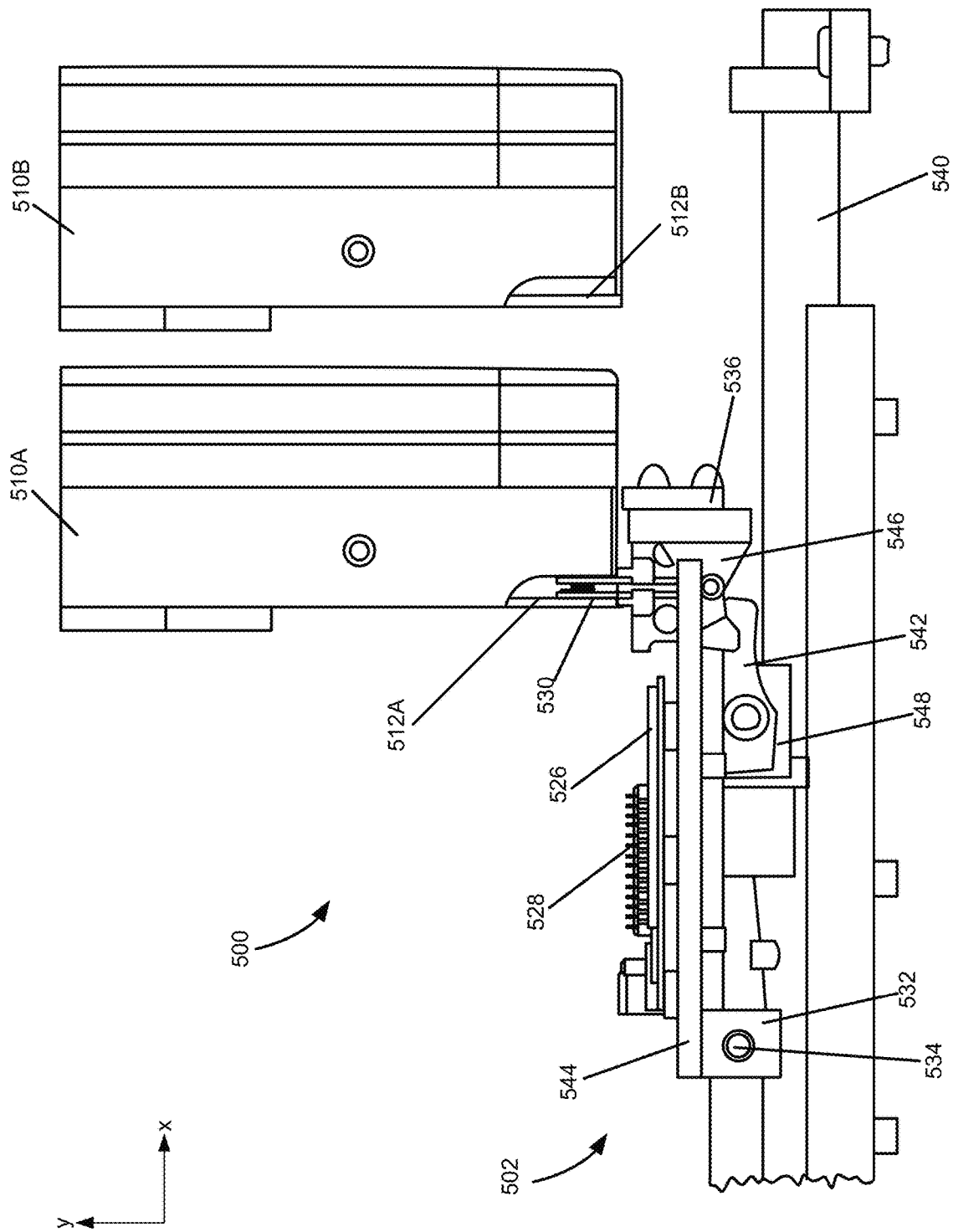

Carriage 502 includes PCB 528 and carriage interconnects 530. In one example, PCB 528 is disposed on a top surface of carriage 502 and includes drive controller 526. In the example of FIG. 5A, carriage 502 is disposed beneath data storage devices 510A and 510B in a position that allows for physical and communicative coupling of carriage interconnects 530 with a first data storage device 510A via drive interconnects 512A.

In some examples, carriage 502 includes tilt bar hinge 532, tilt bar extension 544, and tilt bar backplate 536. Tilt bar hinge 532 defines tilt bar pivot point 534. In the example of FIGS. 5A-5D, tilt bar hinge 532 and tilt bar pivot point 534 are located on the distal side of carriage 502 that is opposite proximal side of carriage 502. Tilt bar backplate 536 may be located at the proximal side of carriage 502. Tilt bar extension 544 is physically coupled to tilt bar hinge 532 at a distal side of carriage 502. Tilt bar extension 544 couples with tilt bar backplate 536 at a proximal side of carriage 502. In other words, tilt bar extension 544 extends along the underside of carriage 502 and couples tilt bar backplate 536 to tilt bar hinge 532. In the example illustrated in FIG. 5A, tilt bar extension 544 is disposed parallel to stage 540.

Carriage 502 also includes tilt arm 542 and tilt arm actuator 548 configured to rotate tilt bar extension 544 and tilt bar backplate 536 about tilt bar pivot point 534. In the example of FIG. 5A, a top surface of tilt arm 542 is physically coupled with a bottom surface of tilt bar tab (e.g., tilt bar tab 438 of FIGS. 4A and 4B).

FIG. 5A further represents carriage interconnects 530 in the "up" or "engaged" position. When carriage interconnects 530 are in the engaged position, carriage interconnects 530 communicatively and mechanically couple to drive interconnects 512A which allows data access operations (e.g., writing or reading of data) at data storage device 510A. In some instances, carriage interconnects 530 are configured to open and close. In such instances, carriage interconnects 530 may close and clamp onto drive interconnect 512A when carriage interconnects 530 are in the engaged position. For instance, carriage interconnects 530 may include a shaped memory alloy (SMA) that opens carriage interconnects 530 in response to receiving an electrical current and closes carriage interconnects 530 in the absence of an electrical current.

Figure 5B:
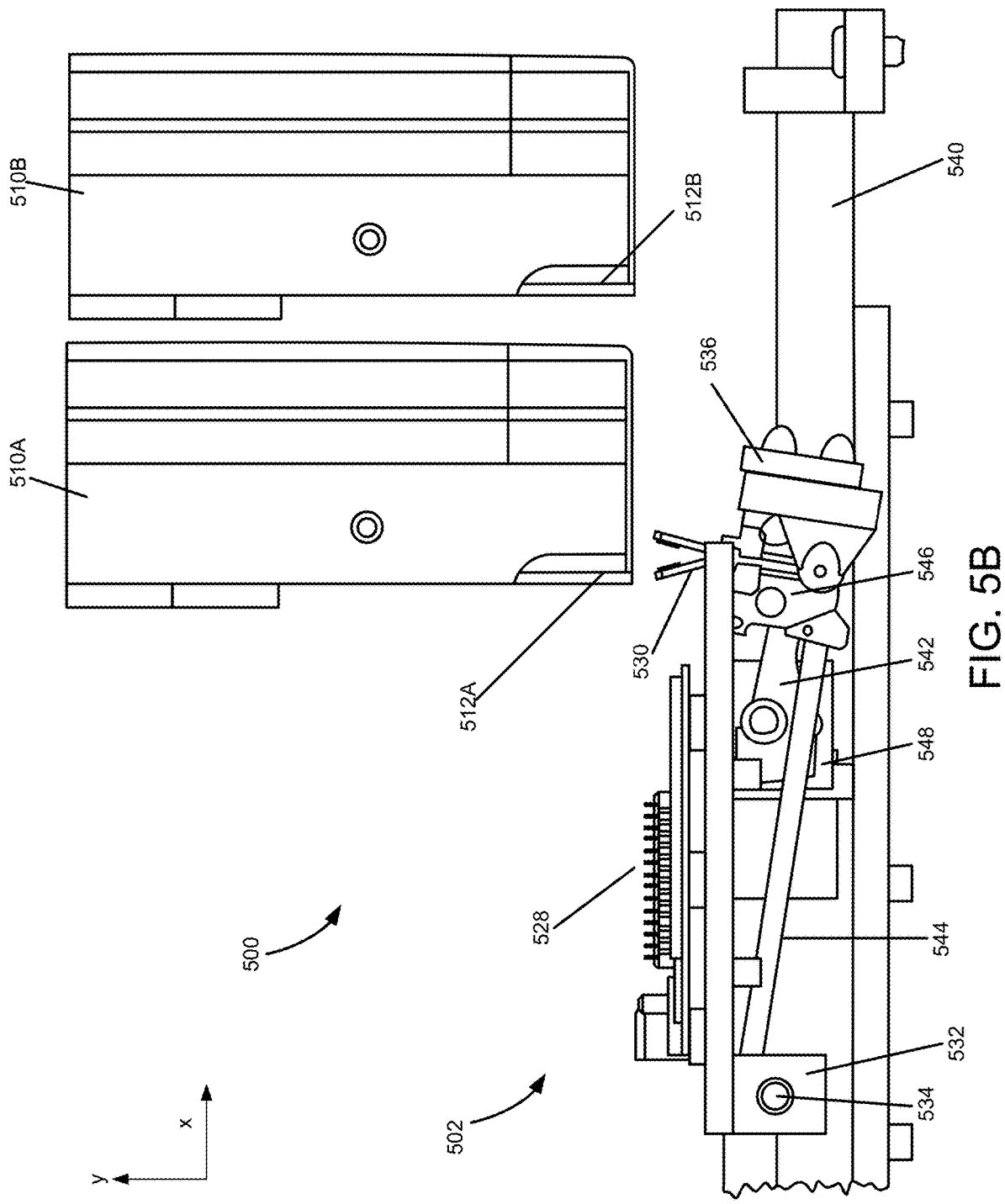
Figure 5D:
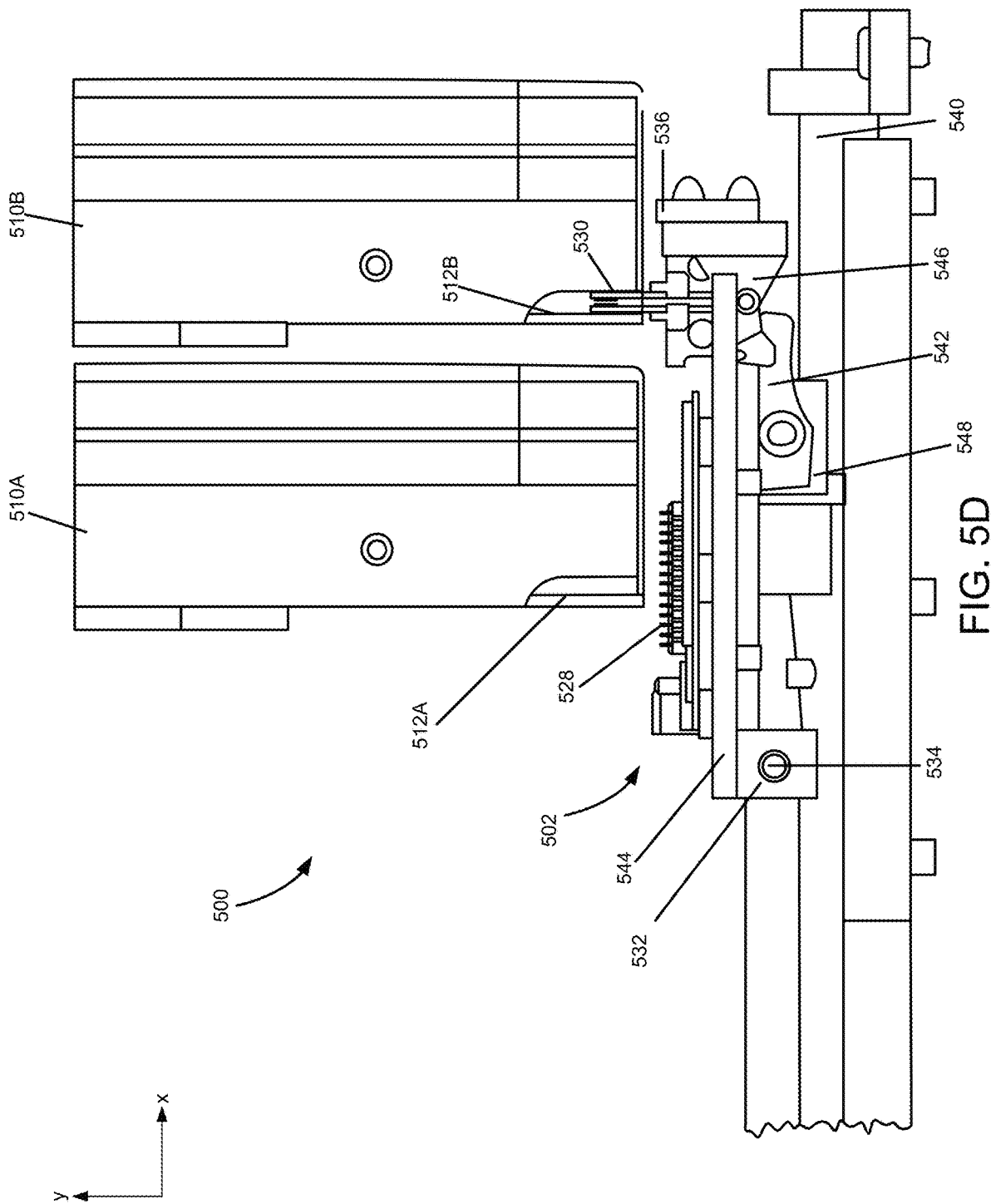

FIGS. 5B, 5C and 5D further describe the motion of carriage 502 during operation of data storage chassis 500. FIG. 5B represents an example of carriage 502 with carriage interconnects 530 in the "down" or "disengaged" position. Following completion of data access at data storage device 510A and in response to receipt of a command from a host (e.g., from a rack controller or other host), chassis controller 124 of FIG. 1 engages tilt arm actuator 548 to rotate tilt arm 542 in a downward motion (in the negative y-direction of FIGS. 5A-5D) away from data storage device 510A. Rotating tilt arm 542 away from data storage device 510A causes tilt bar extension 544 to rotate in the negative-y direction, thus lowering carriage interconnects 530 away from data storage device 510A. In some instances, carriage interconnects 530 open to communicatively de-couple carriage interconnects 530 and drive interconnects 512A. For example, an SMA of carriage interconnects 530 may cease receiving an electrical current which may cause the carriage interconnects 530 to close.

In the example of FIG. 5C, actuation system 122 FIG. 1 causes carriage 502 to move along stage 540 (e.g., along a first axis in the X-direction) in response to receiving a command from a host. For example, actuation system 122 may cause carriage 502 to move from a position for accessing data storage device 510A to a position for accessing data storage device 510B. Said another way, moving carriage 502 from a first lateral position to a second lateral position aligns a plurality of carriage interconnects with a second plurality of drive interconnects of a second set of data storage devices. As carriage 502 is propelled across stage 540, carriage interconnects 530 remain physically and communicatively disengaged from both data storage device 510A and data storage device 510B. For example, lowering carriage interconnects 530 may enable carriage 502 to move under data storage devices 510 (e.g., between data storage devices 510 and a bottom surface of the housing of chassis 500) so as not to physically collide with data storage devices, or with any other component of the housing or chassis during motion.

Carriage 502 may move about stage 540 from a row that includes data storage device 510A and to another row that includes data storage device 510B. For example, as illustrated in FIGS. 5B and 5C, carriage 502 moves along stage 540 in the x-direction below data storage devices 510 (e.g., between data storage devices 510 and a bottom surface of housing of chassis 500). Such movement may include horizontal movement along a first axis and/or vertical movement along a second axis relative toward the target data storage device. In some examples, carriage interconnects 530 move approximately perpendicular (e.g., vertically) to the direction of travel of carriage 502. That is, carriage interconnects 530 may move vertically away from or towards data storage device 510 as tilt bar backplate 536 (and hence, carriage interconnects 530) rotate about pivot point 534.

FIG. 5D illustrates carriage interconnects 530 in the "up" or "engaged" position and physically and communicatively coupled to data storage device 510B. After carriage 502 moves along stage 540 to a position for physical and communicative coupling to data storage device 510B, chassis controller 124 of FIG. 1 engages tilt arm actuator 548 which in turn rotates tilt arm 542 towards data storage device 510B (e.g., in an upward motion or in the y-direction). Rotating tilt arm 542 may cause a tilt bar tab (e.g., tilt bar tab 438 of FIGS. 4A and 4B) tilt bar extension 544 to rotate around tilt bar pivot point 534, thus moving carriage interconnects 530 to move vertically from a first vertical position to a second vertical position (e.g., in the y-direction) towards drive interconnects 512B. In some examples, carriage interconnects 530 physically and communicatively couple to drive interconnects 512B when tilt bar extension 544 is approximately parallel to stage 540. In one example, carriage interconnects 530 close around drive interconnect 512B (e.g., in response to a SMA of the carriage interconnects 530) receiving an electrical current. Data storage device 510B may perform data access operations (e.g., writing or reading of data) in response to communicatively coupling carriage interconnects 530 and drive interconnects 512B.

In one example, carriage 502 is configured to selectively couple with and provide data access to a single data storage devices at a time. In other examples, carriage 502 is adapted to simultaneously couple to multiple storage devices in a row (e.g., the rows illustrated in FIG. 2) and to provide parallel data access operations to two or more of those data storage devices.

FIG. 6 is a perspective view of an example data storage chassis, in accordance with various aspects of the present disclosure. Chassis 602 is configured to store a plurality of data storage magazines 608 and data storage devices 610. In the example of FIG. 6A, chassis 602 is divided into a plurality of compartments 606A and 606B (collectively compartments 606) that are each configured to store a plurality of data storage magazines 608. Chassis 602 may include more or fewer compartments 606. While chassis 602 is illustrated as storing multiple rows of data storage magazines 608, chassis 602 may be configured to store any number of data storage magazines (e.g., 10, 15, 20, or more data storage magazines) within each compartment 606. Each data storage magazine 608 is configured to hold or support a plurality of data storage devices 610 (e.g., in rows or in any other configuration).

Chassis 602 includes a plurality of physical locking mechanisms 652A-652N (collectively, locking mechanisms 652 or slides 652) and a plurality of data storage devices 610. In some examples, including a physical locking mechanism may facilitate the presence of an air-gap between a data storage device 610 and controller 124, such that the controller may be physically isolated from the data storage device.

In some instances, locking mechanisms 652 are configured to move vertically up and down along the side of housing 604. For instance, as shown in FIG. 6, locking mechanisms 652 protrude from housing 604 to the exterior of housing 604, such that locking mechanisms 652 may be manually accessed from the exterior of housing 604 and may be manually pushed into an "up" or a "down" position. In the example of FIG. 6 locking mechanism 652A is in the "up" position and locking mechanism 652B is in the "down" position. In some instances, locking mechanism 652 may be pushed into position by other methods such as by a motor or any other type of mechanical component that is configured to push in a vertical motion. In some examples, locking mechanisms 652 are disposed on the lower portion of a side of housing 604. For example, locking mechanisms 652 may be vertically disposed between a carriage and a data storage device.

While FIG. 6 illustrates twelve locking mechanisms 652 disposed on the side of chassis 602, chassis 602 may include fewer or additional locking mechanisms in some examples. In one example, the quantity or number of locking mechanisms 652 is equal to the number of data storage magazines 608 that chassis 602 is configured to store within a single compartment 606.

Figure 7:
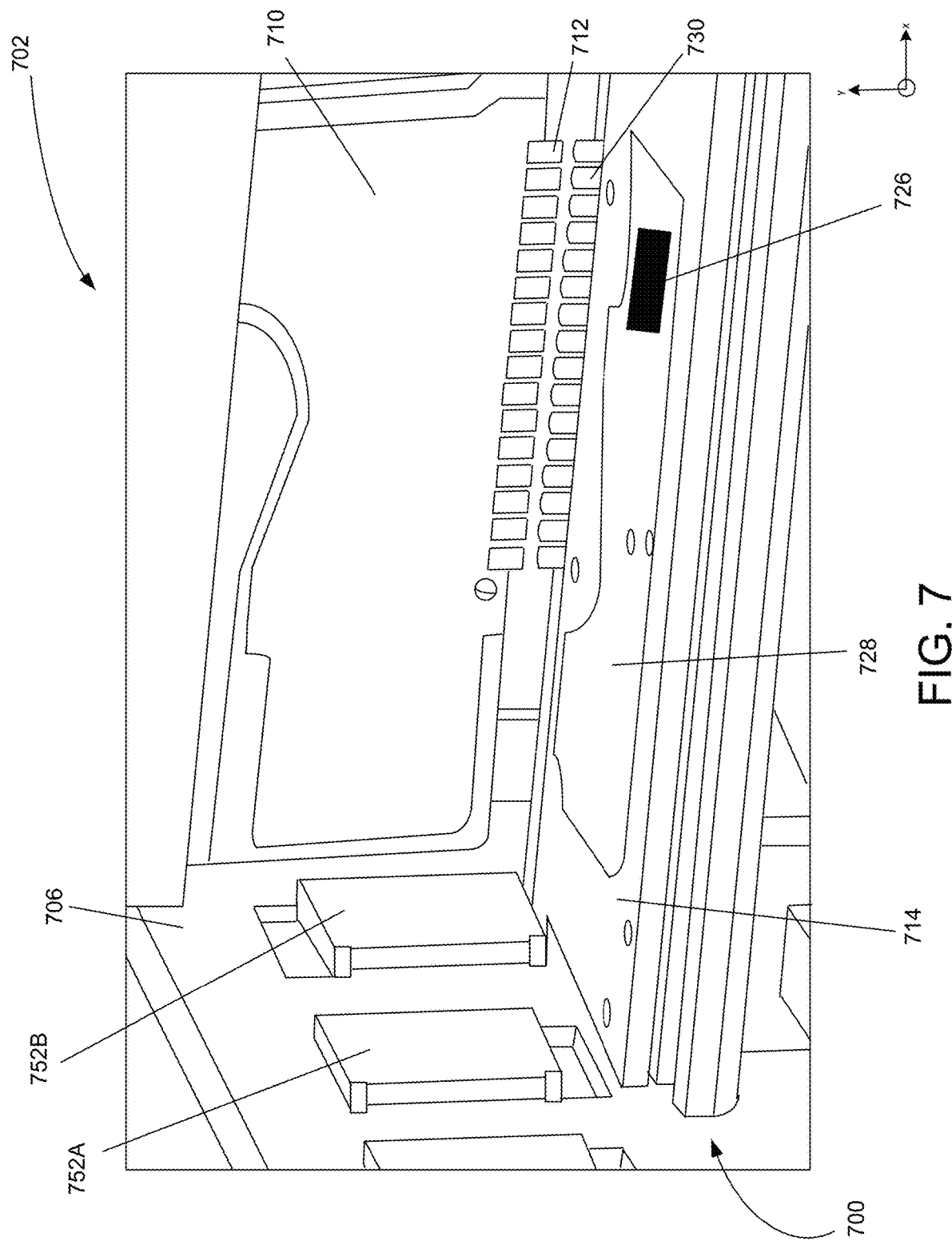
FIG. 7 represents a perspective view of the inside of an example data storage chassis, in accordance with various aspects of the present disclosure.

FIG. 7 represents a perspective view of a portion of the interior of an example data storage chassis, in accordance with various aspects of the present disclosure. Chassis 702 includes movable carriage 700 (also referred to as carriage 700), data storage device 710, and housing 706.

Carriage 700 includes PCB 728, drive controller 726 and carriage interconnects 730. In one example, PCB 728 is disposed on a top surface of carriage 700. In the example of FIG. 7, carriage 700 is disposed beneath data storage device 710 and above a bottom surface of housing 706. Positioning carriage 700 between data storage device 710 and the bottom surface of housing 706 allows for physical and communicative coupling of carriage interconnects 730 with data storage device 710 via drive interconnects 712. In the example of FIG. 7, however, carriage interconnects 730 and drive interconnects 712 are shown as physically and communicatively decoupled from one another. Carriage interconnects 730 may move vertically towards data storage device 710 to physically and communicatively couple carriage interconnects 730 with drive interconnects 712, as described above.

In some examples, chassis 702 includes physical locking mechanisms 752A and 752B (collectively locking mechanisms 752). In some examples, locking mechanisms 752 are configured to selectively prevent carriage 700 from coupling with data storage device 710. In one example, locking mechanisms 752 are configured to prevent carriage interconnects 730 from coupling with drive interconnects 712. For example, each of locking mechanisms 752 may include a locking mechanism configured to move vertically along the side of housing 706. FIG. 7 represents an example of locking mechanisms 752 with locking mechanism 752A in an "up" position and locking mechanism 752B in a "down" position. In an example where locking mechanism 752B is in the up position, locking mechanism 752B is unlocked and allows carriage interconnects 730 to raise towards and couple with drive interconnects 712. As illustrated in the example of FIG. 7, locking mechanism 752B is "locked" when locking mechanism 752B is in the down position. That is, in the example of FIG. 7, when locking mechanism 752B is locked, locking mechanism 752B prevents carriage interconnects 730 from raising towards drive interconnects 712, thus preventing carriage interconnects 730 from coupling with drive interconnects 712. For example, with locking mechanism 752B in the locked position, a bottom surface of locking mechanism 752B is in contact with top surface 714 of carriage 700, which physically prevents carriage interconnects 730 from moving in a vertical direction (along the y-axis in FIG. 7) toward data storage device 710. Blocking vertical movement of carriage interconnects 730 toward data storage device 710 prevents physical and communicative coupling of carriage interconnects 730 with drive interconnects 712.

Locking mechanisms 752 may be placed in an "up" or in a "down" position by a variety of methods, including but not limited to manual placement. In some examples, chassis 702 includes robotics configured to move locking mechanisms 752 vertically (e.g., up, down, or both).

Figure 8A:
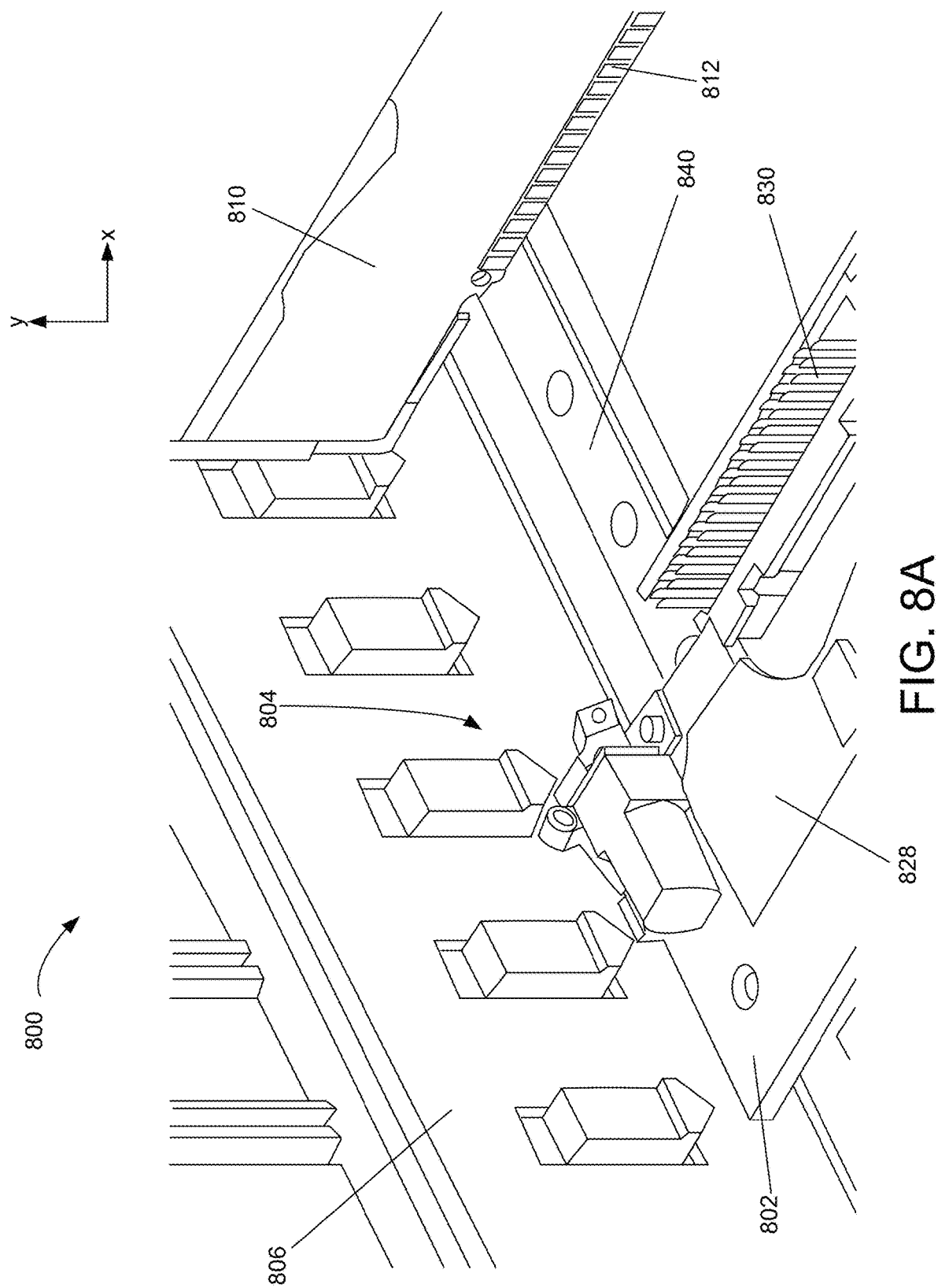
FIGS. 8A, 8B and 8C represent perspective views of the inside of an example data storage chassis and an example locking mechanism, in accordance with various aspects of the present disclosure.
Figure 8B:
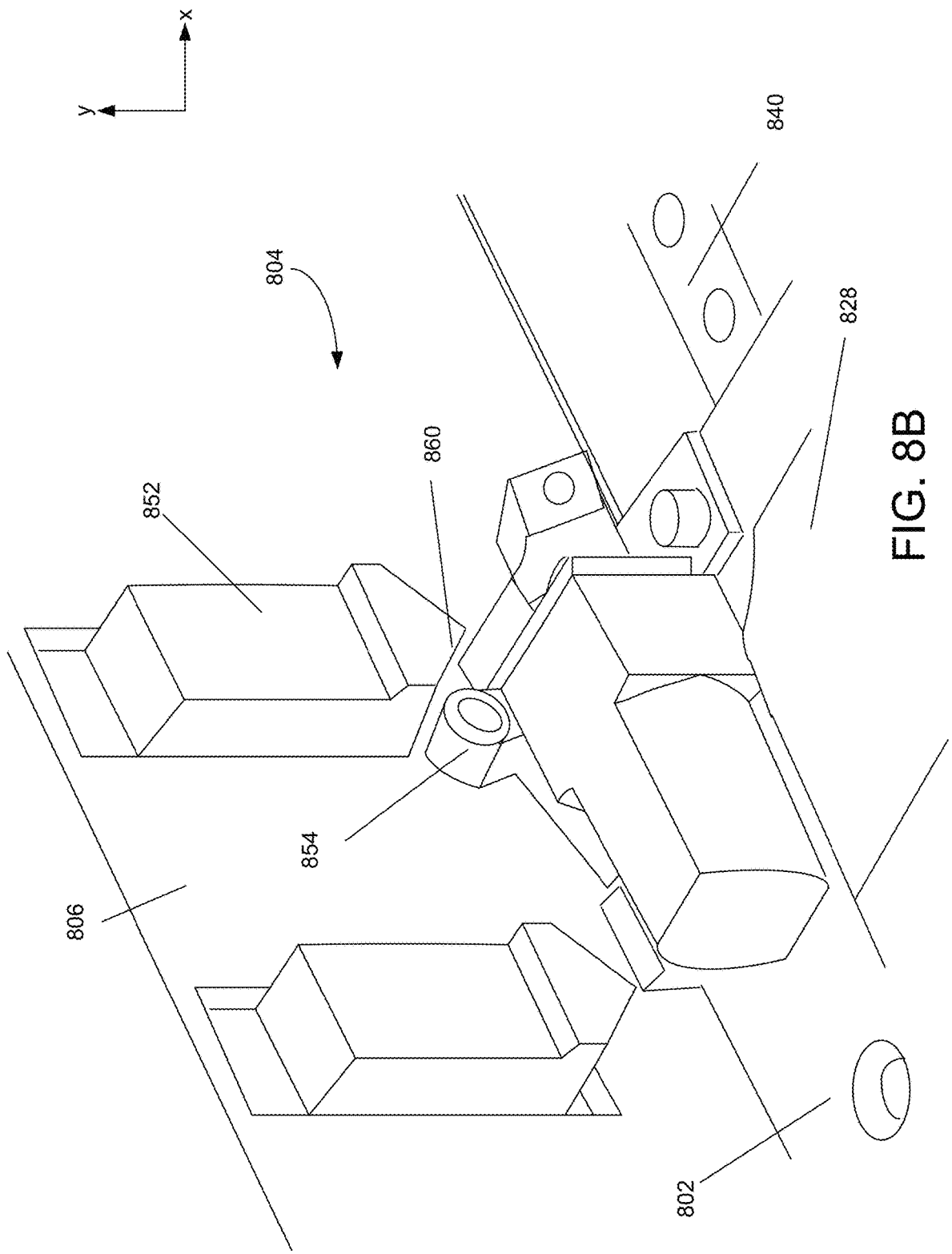
Figure 8C:
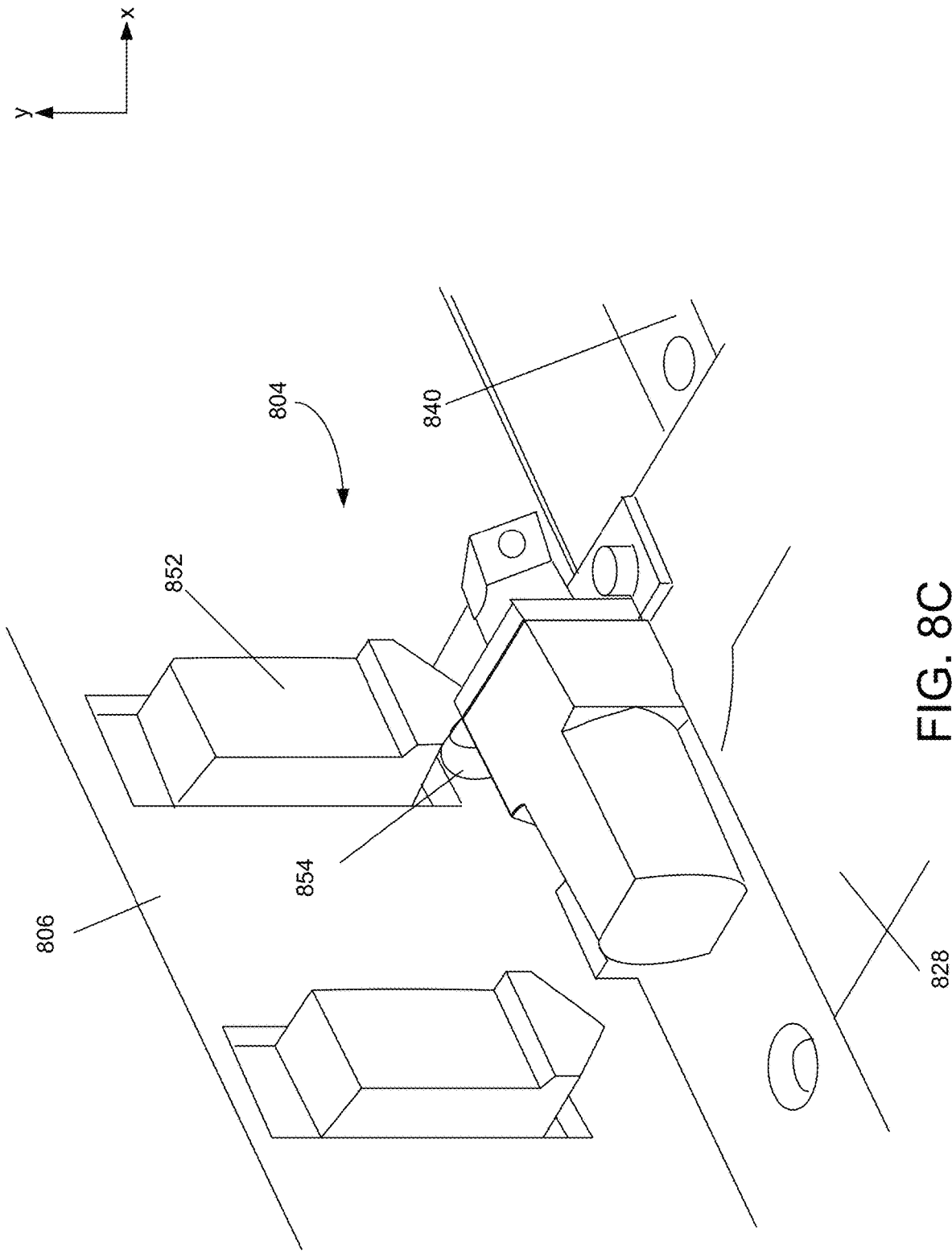

FIGS. 8A, 8B and 8C represent perspective views of the inside of an example data storage chassis and an example physical locking mechanism, in accordance with various aspects of the present disclosure. FIG. 8A is a perspective view of the inside of example data storage chassis and physical locking mechanism, in accordance with various aspects of the present disclosure. In the example of FIG. 8A, data storage chassis 800 includes locking mechanism 804, movable carriage 802, data storage device 810, stage 840 and housing 806. In the example of FIG. 8A, carriage 802 includes PCB 828 and carriage interconnects 830. In one example, PCB 828 is disposed on a top surface of carriage 802. Also illustrated in FIG. 8A is data storage device 810, which includes drive interconnects 812.

FIGS. 8B and 8C illustrate zoomed-in perspective views of locking mechanism 804, in accordance with various aspects of the present disclosure. Locking mechanism 804 is configured to selectively prevent carriage 802 from coupling to data storage device 810. In one example, locking mechanism 804 enables carriage 802 to couple to data storage device 810 by electrically coupling a tilt arm actuator (e.g., tilt arm actuator 448 of FIGS. 4A-4B) from a power source (e.g., power source 130 of FIG. 1) and prevents carriage 802 from coupling with data storage device 810 by electrically isolating the tilt arm actuator from the power source.

In the example of FIG. 8B, locking mechanism 804 includes slide 852 disposed on housing 806 and switch 854 disposed on carriage 802. Slide 852 is configured to travel vertically along housing 806. In one example, slide 852 includes a tapered edge 860 (e.g., tapered towards carriage 802) configured to urge switch 854 towards the top surface of carriage 802. Switch 854 is configured to selectively electrically couple the tilt arm actuator to the power source based on a vertical position of slide 852. In the example of FIG. 8, switch 854 is a mechanical switch but switches of other types may be used. Examples of switches 854 include optical switches, opto-mechanical or optical switches, electrostatic switches, and magnetic switches, among other types of switches.

In some examples, locking mechanism 804 electrically couples the tilt arm actuator to the power source when slide 852 physically contacts a portion of carriage 802 (e.g., switch 854). In one example, slide 852 urges switch 854 toward the top surface of carriage 802 when slide 852 is in an unlocked (e.g., down) position. For example, as carriage 802 is propelled horizontally across stage 840, switch 854 makes contact with slide 852 and traverses along tapered edge 860 of slide 852. In one example, as switch 854 moves along tapered edge 860, switch 854 is pushed in a downward direction (negative Y-direction) towards stage 840. Switch 854 may contact the top surface of carriage 802, as illustrated in FIG. 8C, which may electrically couple the tilt arm actuator (e.g., tilt arm actuator 448 of FIGS. 4A-4B) to the power source (e.g., power source 130 of FIG. 1). Electrically coupling the tilt arm actuator to the power source enables the actuator to lift carriage interconnects 830 from a first vertical position to a second vertical position towards drive interconnects 812 to communicatively couple interconnects 812 and 830. In this way, locking mechanism 804 may enable carriage 802 to couple to data storage device 810 by electrically coupling the tilt arm actuator to the power source.

Locking mechanism 804 electrically isolates the tilt arm actuator from the power source when slide 852 does not physically contact a portion of carriage 802 (e.g., switch 854). In one example, when locking mechanism 804 is in a locked (e.g., up) position, switch 854 may travel between slide 852 and the top surface of carriage 802 without contacting slide 852, such that switch 854 remains above the top surface of carriage 802 and the tilt arm actuator is electrically isolated from the power source (e.g., the circuit remains open). In another example, switch 854 may contact slide 852 without contacting the top surface of carriage 802 (e.g., by not traversing far enough down tapered edge 860), such that the circuit remains open and the tilt arm actuator is electrically isolated from the power source. Electrically isolating the tilt arm actuator from the power source prevents carriage 802 from moving vertically towards data storage device 810. In this way, locking mechanism 804 prevents carriage 802 from communicatively coupling to data storage device 810 by electrically isolating the tilt arm actuator from the power source.

Figure 9:
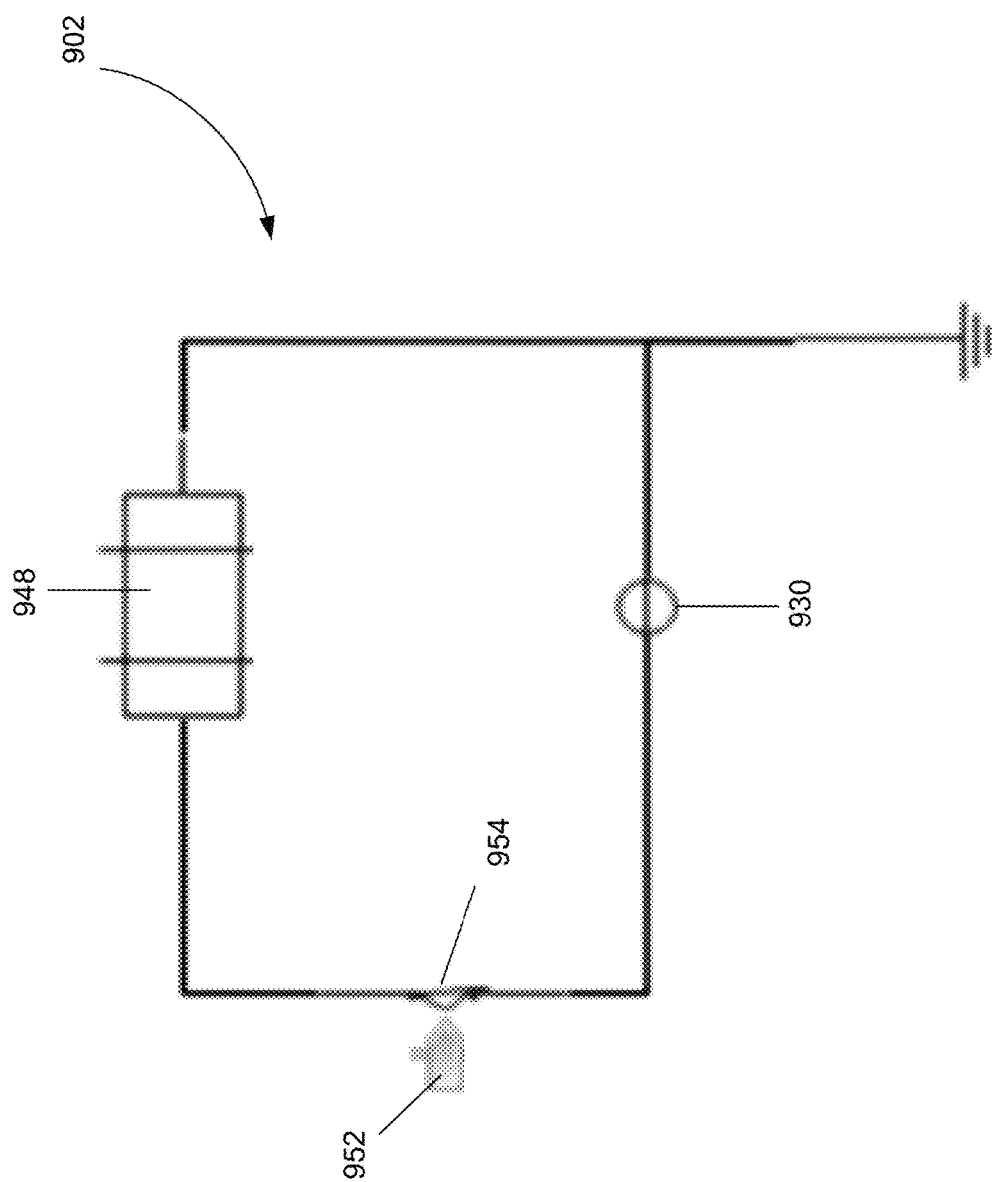
FIG. 9 is a circuit diagram for an example data storage chassis, in accordance with various examples of the present disclosure

FIG. 9 is a circuit diagram for an example data storage chassis, in accordance with various examples of the present disclosure. Circuit 902 includes power source 930, load 948, and switch 954. In some examples, load 948 includes a tilt arm actuator (e.g., tilt arm actuator 448 of FIG. 4). In the example of FIG. 9, slide 952 is configured to travel vertically along a chassis housing (e.g., housing 806 of FIG. 8C) and selectively close switch 954. Switch 954 is configured to selectively electrically couple power source 930 to load 948. In one example, switch 954 is open when slide 952 is in the unlocked locked position. Switch 954 electrically isolates power source 930 from load 948 when switch 954 is in the open position. In another example, switch 954 closes when slide 952 is in the closed position and contacts switch 954. Switch 954 electrically couples power source 930 to load 948 when switch 954 is closed. In an example where load 948 includes a tilt arm actuator, electrically coupling power source 930 to the tilt arm actuator enables the tilt arm actuator to move vertically to couple the carriage interconnects with the drive interconnects, as described in FIGS. 5A to 5D.

In some examples, load 948 may include a drive controller (e.g., 326 of FIG. 3) or to a PCB (e.g., 328 of FIG. 3) or to actuator (e.g., 242 of FIG. 2). In this way, in some examples, switch 954 may be configured to selectively electrically couple power source 930 to a drive controller, a PCB, and/or actuator 242.

Figure 10A:
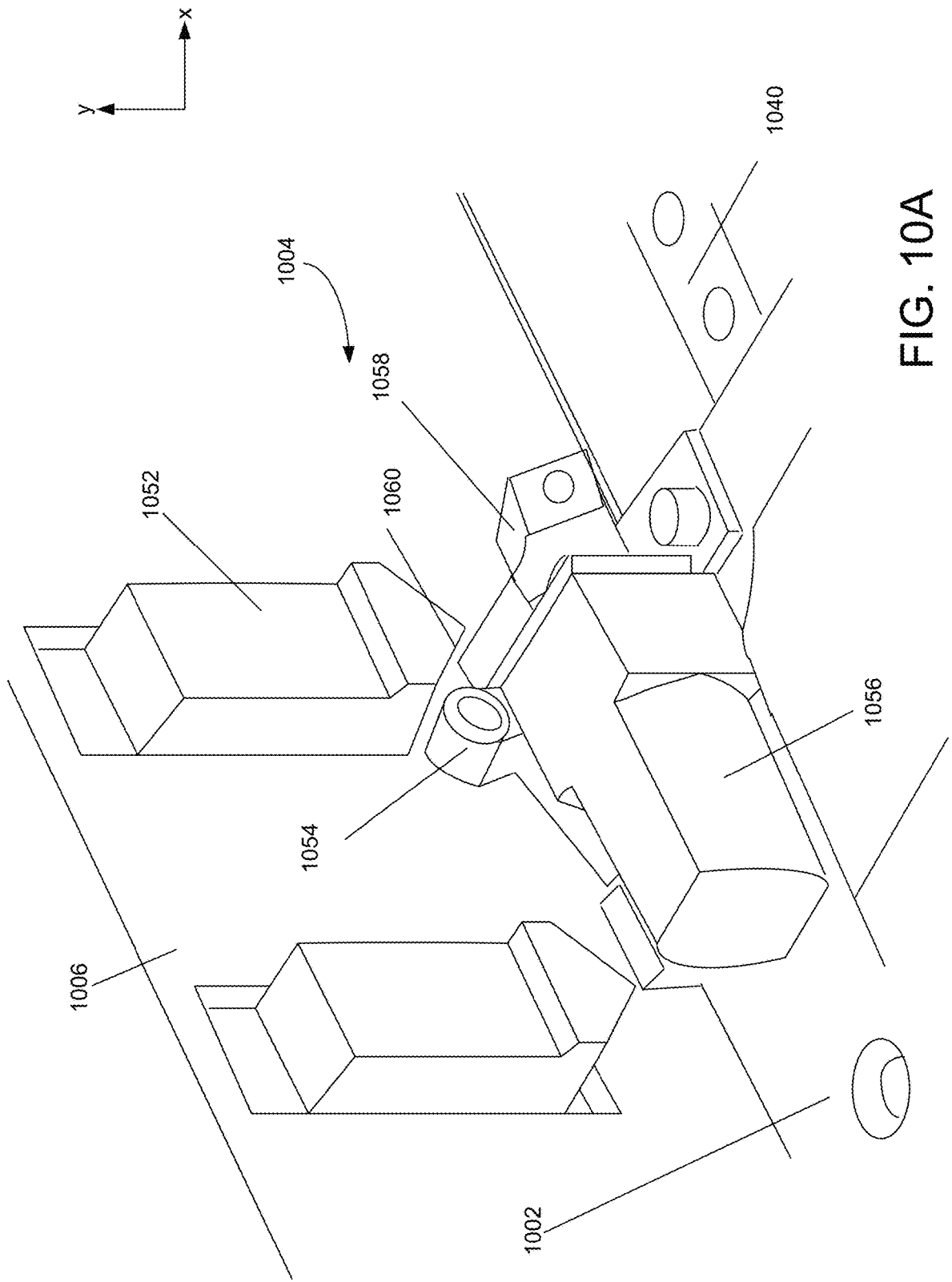
FIGS. 10A and 10B represent perspective views of the inside of an example data storage chassis and an example locking mechanism, in accordance with various aspects of the present disclosure.
Figure 10B:
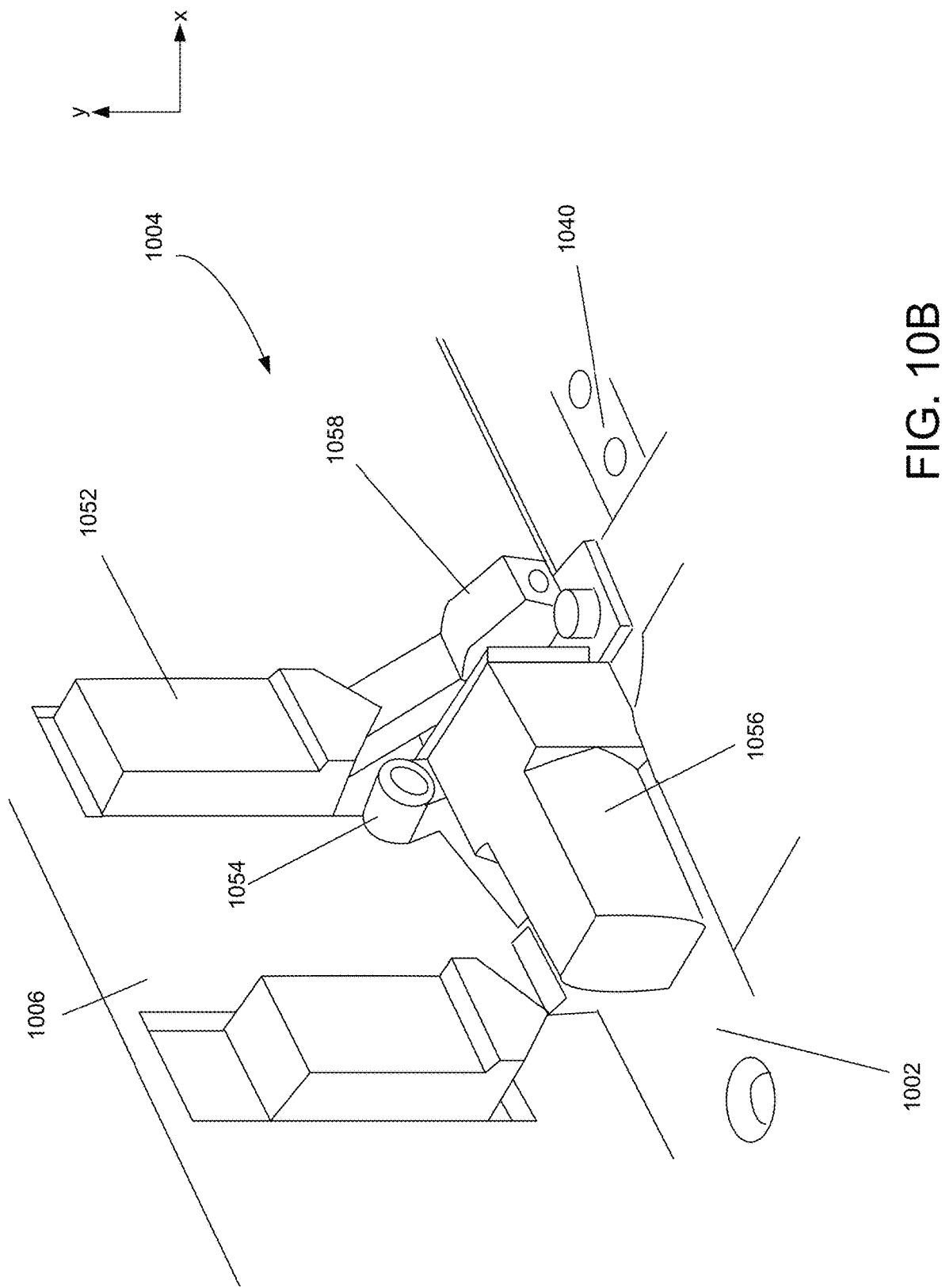

FIGS. 10A and 10B represent perspective views of the inside of an example data storage chassis and an example locking mechanism, in accordance with various aspects of the present disclosure. FIG. 10A is a zoomed-in perspective view of locking mechanism 1004 in accordance with various aspects of the present disclosure.

In the example of FIG. 10A, locking mechanism 1004 includes slide 1052 disposed on housing 1006 and switch 1054 disposed on carriage 1002. Slide 1052 is configured to travel vertically along housing 1006. In one example, slide 1052 includes a tapered edge 1060 (e.g., tapered towards carriage 1002) configured to urge switch 1054 towards the top surface of carriage 1002. Switch 1054 is configured to open and close tilt arm actuator circuit based on a vertical position of slide 1052. Switch 1054 is configured to selectively electrically couple a tilt arm actuator (e.g., tilt arm actuator 448 of FIGS. 4A-4B) to a power source (e.g., power source 130 of FIG. 1). FIG. 10A illustrates locking mechanism 1004 in an unlocked (e.g., down) position thus enabling switch 1054 to close the tilt arm actuator circuit and the tilt arm actuator to raise the carriage interconnects towards the drive interconnects to communicatively couple the carriage interconnects and drive interconnects, as previously described.

Locking mechanism 1004 further includes lever 1058 configured to selectively lock slide 1052 and actuator 1056 configured to drive lever 1058. While FIGS. 10A and 10B show actuator 1056 and lever 1058 disposed on the top surface of carriage 1002, in some examples actuator 1056 and/or lever 1058 may be located on a different surface of carriage 1002. In one example, lever 1058 is physically coupled to actuator 1056 and actuator 1056 may be electrically coupled to a power source (e.g., power source 130 of FIG. 1). Actuator 1056 may be configured to move lever 1058 in an upward direction (positive Y-direction in FIG. 10B) or downward direction (negative Y-direction). In operation, actuator 1056 may drive lever 1058 upwards to lock slide 1052. In one instance, raising lever 1058 in an upward direction may cause lever 1058 to make physical contact with slide 1052, hence pushing slide 1052 away from stage 1040 and into the locked (e.g., up) position, as illustrated in FIG. 10B. For instance, placing slide 1052 in the locked position may cause switch 1054 to open, thus electrically isolating the tilt arm actuator from the power source, which may prevent the tilt arm actuator from coupling the carriage interconnects and drive interconnects. In some examples, slide 1052 may also be accessed from the exterior of housing 1006 and manually moved into the same locked position. Slide 1052 may also be manually moved into an unlocked position from the exterior of housing 1006. Slide 1052 may not, however, be robotically moved into an unlocked position from inside housing 1006. Though actuator 1056 may vertically drive lever 1058 upwards to lock slide 1052, there is no mechanism on the interior of housing 1006 by which lever 1058 can be robotically moved vertically downwards to unlock slide 1052. This provides an advantage from a data security perspective as slide 1052 cannot be unlocked from a remote location and physical access to the drive is required in order to manually unlock slide 1052.

In some examples, actuator 1056 may lower lever 1058 after placing slide 1052 in the locked position. Lowering lever 1058 may enable carriage 1002 to move between data storage magazines (e.g., horizontally along stage 1040).

In some scenarios, a chassis includes additional physical locking mechanisms. In one example, a physical locking mechanism includes a rod or pin configured to prevents translation of movable carriage 1002 across stage 1040 from a first lateral position to a second lateral position within chassis (e.g., chassis 800 of FIG. 8A). Preventing translation of carriage 1002 across stage 1040 may prevent the carriage from aligning with the data storage devices and thus prevent subsequent communicative and mechanical coupling of carriage interconnects (e.g., carriage interconnects 830 of FIG. 8A) with drive interconnects (e.g., drive interconnects 812 of FIG. 8A). This lack of communicative and mechanical coupling may prevent data access operations (e.g., writing or reading of data from a data storage device). In one example, the chassis may include one pin or a plurality of pins configured to restrict lateral motion of the carriage and prevent the carriage from accessing a single row of data storage devices, a plurality of rows of data storage devices or an entire chassis of data storage devices.

In some examples, the chassis may utilize additional mechanisms to restrict access to data storage devices and/or the data stored on such data storage devices. For example, the data storage devices may encrypt data stored on one or more data storage devices.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" features or steps need not necessarily appear in that order, and the embodiments thereof need not necessarily be limited to three features or steps. It should also be understood that the singular forms of "a," "an," and "the" include plural references unless the context clearly dictates otherwise. Spatially relative terms such as "above", "below", "upper", "lower", "proximal", "distal", "vertical", "horizontal", "left", and "right", among other spatially relative terms, may be used to describe one feature's relationship to another feature as illustrated in the figures. Vertical and horizontal are spatially relative terms.

Various examples have been presented for the purposes of illustration and description. These and other examples are within the scope of the following claims.

What is claimed is:

1. An apparatus comprising:
 a housing configured to store a plurality of data storage magazines, each data storage magazine of the plurality of data storage magazines including a respective plurality of data storage devices,
 a movable carriage disposed within the housing, the movable carriage comprising a plurality of carriage interconnects that are each configured to communicatively and mechanically mate with a drive interconnect of a respective data storage device of a particular data storage magazine of the plurality of data storage magazines; and a physical locking mechanism disposed on a side of the housing, the physical locking mechanism configured to selectively prevent the carriage interconnects from communicatively and mechanically coupling to the drive interconnects.

2. The apparatus of claim 1 comprising:
a power source;
an actuator configured to move the carriage interconnects on the movable carriage toward the particular data storage magazine; and
a switch configured to selectively couple the power source to the actuator,
wherein the physical locking mechanism prevents the carriage interconnects of the movable carriage from coupling to the drive interconnects of the particular data storage magazine by restricting movement of the movable carriage toward the particular data storage magazine.

3. The apparatus of claim 2, wherein the physical locking mechanism prevents the movable carriage from moving vertically toward the particular data storage magazine by opening the switch to isolate the actuator from the power source when the physical locking mechanism is in a locked position.

4. The apparatus of claim 2, wherein the physical locking mechanism enables the movable carriage to move vertically towards the particular data storage magazine by closing the switch to couple the actuator to the power source when the physical locking mechanism is in an unlocked position.

5. The apparatus of claim 2, further comprising a lever configured to selectively move the physical locking mechanism from a first vertical position to a second vertical position to place the physical locking mechanism in a locked position.

6. The apparatus of claim 2, wherein the actuator is a first actuator, the carriage further comprising a second actuator configured to drive a lever to cause the lever to move the physical locking mechanism from a first vertical position to a second vertical position to place the physical locking mechanism in a locked position.

7. The apparatus of claim 2, wherein the physical locking mechanism closes the switch as the carriage moves horizontally under the physical locking mechanism when the physical locking mechanism is in an unlocked position.

8. The apparatus of claim 7, wherein the switch includes a mechanical switch and the physical locking mechanism closes the switch by physically contacting the mechanical switch.

9. The apparatus of claim 7, wherein the physical locking mechanism comprises:
a tapered edge configured to urge the switch to a closed position as the carriage moves horizontally under the physical locking mechanism.

10. The apparatus of claim 2, wherein the switch includes one of an optical switch, an electrostatic switch, or a magnetic switch.

11. The apparatus of claim 1, wherein the physical locking mechanism is not robotically movable from a locked position to an unlocked position from inside the housing.

12. The apparatus of claim 1, wherein the physical locking mechanism is manually movable from a locked position to an unlocked position from the exterior of the housing.

13. The apparatus of claim 1, wherein the physical locking mechanism is a first physical locking mechanism, the apparatus further comprising a second physical locking mechanism configured to prevent movement of the movable carriage about the housing.

14. The apparatus of claim 13,
wherein the second physical locking mechanism comprises a plurality of slides;
wherein the slides are manually movable between an unlocked and a locked position, and
wherein the slide physically prevents communicative coupling of the movable carriage with a set of data storage magazines when the slide is in the locked position.

15. The apparatus of claim 1, wherein the housing comprises a pin configured to physically block horizontal movement of the movable carriage.

16. A method comprising:
aligning a movable carriage with a plurality of carriage interconnects to align the plurality of carriage interconnects with a plurality of drive interconnects of a set of data storage devices;
selectively preventing the plurality of carriage interconnects from communicatively and mechanically coupling with the drive interconnects by selectively preventing movement of the movable carriage.

17. The method of claim 16, wherein selectively preventing the plurality of carriage interconnects from coupling with the drive interconnects includes restricting vertical movement of the carriage interconnects towards the drive interconnects when a physical locking mechanism is in a locked position.

18. The method of claim 16, wherein selectively preventing the plurality of carriage interconnects from coupling with the drive interconnects includes coupling an actuator to a power source to allow vertical movement of the carriage interconnects towards the drive interconnects when the locking mechanism is in an unlocked position.

19. The method of claim 18, wherein coupling the actuator to the power source includes closing a switch as the carriage moves horizontally under the physical locking mechanism when the physical locking mechanism is in the unlocked position.

20. The method of claim 19, wherein closing the switch comprises contacting a tapered edge of the physical locking mechanism when the movable carriage moves horizontally under the physical locking mechanism.

* * * * *